(12) United States Patent
Schwalbe et al.

(10) Patent No.: US 7,008,849 B2
(45) Date of Patent: Mar. 7, 2006

(54) METHOD FOR PROVIDING BITLINE CONTACTS IN A MEMORY CELL ARRAY AND A MEMORY CELL ARRAY HAVING BITLINE CONTACTS

(75) Inventors: Grit Schwalbe, Dresden (DE); Kae-Horng Wang, Dresden (DE); Klaus Feldner, Dresden (DE); Elard Stein Von Kamienski, Dresden (DE)

(73) Assignee: Infineon Technologies AG, Munich (DE)

( * ) Notice: Subject to any disclaimer, the term of this patent is extended or adjusted under 35 U.S.C. 154(b) by 52 days.

(21) Appl. No.: 10/724,903

(22) Filed: Dec. 1, 2003

(65) Prior Publication Data

US 2004/0120198 A1   Jun. 24, 2004

Related U.S. Application Data

(63) Continuation of application No. PCT/EP02/05805, filed on May 27, 2002.

(30) Foreign Application Priority Data

May 30, 2001 (EP) .................................. 01113178
May 30, 2001 (EP) .................................. 01113179

(51) Int. Cl.
    *H01L 21/8236*   (2006.01)
(52) U.S. Cl. ........................ 438/278; 438/700
(58) Field of Classification Search .............. 438/130, 438/233, 278, 128
    See application file for complete search history.

(56) References Cited

U.S. PATENT DOCUMENTS

| | | | |
|---|---|---|---|
| 4,390,971 A * | 6/1983 | Kuo | .............. 365/104 |
| 5,168,334 A | 12/1992 | Mitchell et al. | |
| 5,384,478 A * | 1/1995 | Hong | .............. 257/385 |
| 5,455,535 A * | 10/1995 | Sauer | .............. 327/560 |
| 5,517,061 A * | 5/1996 | Azmanov | .............. 257/758 |
| 5,539,235 A * | 7/1996 | Allee | .............. 257/390 |
| 5,624,862 A * | 4/1997 | An | .............. 438/276 |
| 5,768,192 A | 6/1998 | Eitan | |

(Continued)

FOREIGN PATENT DOCUMENTS

JP       10-242289    *  9/1998

OTHER PUBLICATIONS

Takhyun Yoon et al.: "A New Process Integration—$P^3$ (Pre Poly Plug)—for Giga Bit DRAM Era", *Symposium on VLSI Technical Digest*, Aug. 1999, 2 pgs.

(Continued)

*Primary Examiner*—W. David Coleman
(74) *Attorney, Agent, or Firm*—Laurence A. Greenberg; Werner H. Stemer; Ralph E. Locher

(57) ABSTRACT

A method for providing bitline contacts in a memory cell array includes a plurality of bitlines disposed in a first direction, the bitlines being covered by an isolating layer, a plurality of wordlines disposed in a second direction perpendicular to the first direction above the bitlines, and memory cells disposed at the points at which the bitlines and wordlines cross each other. According to a first aspect of the present invention, the isolating layer is removed from the bitlines at the portions that are not covered by the wordlines, whereas the areas between the bitlines remain unaffected. Alternatively, the isolating layer is removed from the whole cell array. Then, an electrical conductive material is provided on the exposed portions of the bitlines. The method is used to provide bitline contacts in a nitride read only memory (NROM™) chip.

25 Claims, 15 Drawing Sheets

U.S. PATENT DOCUMENTS

| | | |
|---|---|---|
| 5,815,433 A | 9/1998 | Takeuchi |
| 5,915,203 A | 6/1999 | Sengupta et al. |
| 5,963,465 A | 10/1999 | Eitan |
| 5,966,603 A | 10/1999 | Eitan |
| 6,124,169 A * | 9/2000 | Camerlenghi et al. ...... 438/263 |
| 6,124,192 A * | 9/2000 | Jeng et al. .................. 438/597 |
| 6,133,095 A | 10/2000 | Eitan et al. |
| 6,221,722 B1 * | 4/2001 | Lee ............................ 438/275 |

OTHER PUBLICATIONS

Jong-Wan Jung et al.: "A fully working 0.14$\mu$m DRAM technology with polymetal (W/WNx/Poly-Si) gate", *IEEE*, 2000, 4 pg.

* cited by examiner

METHOD FOR PROVIDING BITLINE CONTACTS IN A MEMORY CELL ARRAY AND A MEMORY CELL ARRAY HAVING BITLINE CONTACTS

CROSS-REFERENCE TO RELATED APPLICATION

This application is a continuation of copending International Application No. PCT/EP02/05805, filed May 27, 2002, which designated the United States and was published in English.

BACKGROUND OF THE INVENTION

Field of the Invention

The present invention relates to a method for providing bitline contacts in a memory cell array in which a plurality of bitlines is disposed in a first direction, the bitlines being covered by a silicon dioxide layer, a plurality of wordlines is disposed in a second direction perpendicular to the first direction above the bitlines, and memory cells are disposed at the points at which the bitlines and wordlines cross each other.

The present invention can very advantageously applied to an EEPROM memory cell which is known from U.S. Pat. No. 5,168,334 to Mitchell et al. and which is also referred to as an NROM™ (nitride read only memory) cell which is further described in U.S. Pat. No. 5,966,603 to Eitan, U.S. Pat. No. 5,768,192 to Eitan, U.S. Pat. No. 6,133,095 to Eitan et al., and U.S. Pat. No. 5,963,465 to Eitan.

Such an NROM™ cell is a charge trapping memory device, which can be seen as a simple sub-micron MOS transistor whose gate oxide is replaced with a thin oxide-nitride-oxide (ONO) multi-layer stack, as can be seen from FIG. 1. In FIG. 1, reference numeral 1 denotes a substrate, for example of p-doped silicon. N$^+$-doped bitlines 2a, 2b are disposed in a first direction, and they are covered by a thick silicon dioxide layer having a thickness of approximately 50 nm, also referred to as the bitline oxide 3. The word lines 4 made of polycide, a dual layer structure of tungsten silicide and polysilicon, are disposed in a second direction crossing the first direction. The second direction is, preferably, perpendicular to the first direction. The ONO multi-layer including a silicon dioxide layer 5, a silicon nitride layer 6, and a silicon dioxide layer 7, is disposed between the wordline 4 and the silicon substrate 1. A transistor having a channel 13 is formed between two adjacent bitlines 2a, 2b acting as source and drain electrode, the wordline 4 acting as the gate electrode and the ONO multi-layer acting as the gate isolator. The ONO multi-layer covers the channel area 13 of the transistor.

The intermediate layer of the ONO multi-layer stack, i.e., the nitride layer 6, is the retaining material for one or two distinguishable pockets of electrons, close to the bitline 2 junction edge.

For sake of simplicity, the concept of the NROM™ cell is described for the storage of one electron only. However, currently, the NROM™ cell is also applied for the storage of two electrons.

FIG. 2 shows a top view of a two-dimensional array of NROM™ cells, made of a crisscross of n$^+$-doped bitlines 2 and wordlines 4. The location of the trapped electron is near the bitline junction edge, as shown in FIG. 1. Also shown is the memory cell 11 at the cross-section whose details are shown in FIG. 1. The programming operation of the NROM™ cell is done by Channel Hot Electron injection, which stores a nominal less than a thousand electrons in a lumped pocket close to the drain side of the cell. These electrons are located in localized states in the nitride layer.

An electron 8, for example, is injected and trapped by applying a higher potential to the first bitline 2a than to the second bitline 2b, as is indicated by the programming direction 10. Additionally, a sufficient voltage is applied to the wordline 4. For reading the electron 8, a higher potential is applied to the second bitline 2b than to the first bitline 2a, as is indicated by the reading direction 9. Additionally, a low voltage is applied to the wordline 4.

As is obvious, the potential difference applied for reading is lower than the potential difference applied for programming. Because a comparatively high voltage is applied to the wordlines for programming, the thickness of the spacer that covers the wordlines must be thicker than in other known memory devices such as a dynamic random access memory (DRAM) in order to avoid a breakthrough between neighboring wordlines or between a wordline and a bitline contact. In particular, typical voltages applied to the wordlines of NROM™ cells are approximately 12 Volts, whereas typical voltages applied to the wordlines of DRAM cells are 3 to 5 Volts.

Because the n$^+$-doped bitlines 2 exhibit a considerable resistance, according to a standard cell architecture, metal lines are disposed on top of the memory cell array in arrays having a certain magnitude. These metal lines are also disposed in the first direction above the bitlines 2, and they are periodically connected to the underlying bitline through a contact. For example, every 8th or 16th memory cell has a contact to the metal line so as to reduce the bitline resistance. Because these metal lines usually are very thick, they place a further restriction upon the shrinkage of the memory cell size.

Conventionally, the contact between bitline and metal line can be provided by a method in which after the formation of the wordlines the whole memory cell array is covered by a boron phosphorous silicate glass as well as a silicon dioxide layer. Then, the silicon dioxide layer, the boron phosphorous silicate glass as well as the underlying bitline oxide are etched at predetermined positions that are, for example, photolithographically defined using a mask having a hole pattern so as to provide the contact holes. Thereafter, the contact holes are etched selectively with respect to the wordlines, especially the nitride spacer and nitride cap of the gate electrodes. Accordingly, the lateral extension of the contact holes is substantially defined by the spacing between neighboring wordlines. For this reason, such a contact is called a self-aligned contact (SAC).

Such a process involves two major disadvantages. On one hand, as explained above, the voltages applied to the wordlines of NROM™ cells are much higher than those applied to the wordlines of other known memory cells such as DRAM cells. Therefore, the nitride spacer and the cap nitride have to withstand much higher voltages and, thus, are made thicker. Consequently, the space between neighboring wordlines is reduced and the aspect ratio of the contact holes is much increased. In more detail, because the silicon dioxide layer usually has a thickness of 500 nm, contact holes having a very high aspect ratio of 10 to 15 have to be etched. Thus, it becomes very difficult to entirely etch the silicon dioxide layer, the phosphorous boron silicate glass as well as the underlying bitline oxide and, subsequently, fill the space between neighboring wordlines.

On the other hand, the etching time has to be appropriately adjusted to avoid too much etching of the nitride spacer. Accordingly, the process of etching the bitline oxide during the NROM™ fabrication is very critical. Insufficient etching times will result in an insufficient contact between bitline and bitline contact. However, for a better device performance, a low RC constant of the bitline contact is necessary to achieve a higher saturation current and a better signal detection. Moreover, excessive etching times will result in shorts between bitline contact and wordline that is a major problem in the fabrication of memory cell arrays.

By introducing a new etching gas, especially $C_5F_8$, having a higher selectivity of etching silicon dioxide deposited by the TEOS process with respect to silicon nitride, or by depositing a phosphorous boron silicon glass having a reduced thickness so that the stack that must be etched assumes a reduced height, the above problems can be partially solved. However, the results obtained still are not entirely satisfactory.

Another drawback arises because neighboring bitlines are insufficiently isolated from each other. Accordingly, there is a remarkable danger of punchthrough or leakage. Such a problem could be alleviated by introducing additional shallow trench isolation (STI) processes into the manufacturing process. However, the introduction of a conventional STI process into the hitherto known process of manufacturing an NROM™ cell array would lead to an increased cell size due to overlay requirements.

From T. H. Yoon et al., Symp. on VLSI Tech. Dig., 1999, p. 37, it is known to replace an SAC process by a so-called Pre Poly Plug process in which doped silicon is entirely deposited and patterned so as to provide a cell plug in a DRAM cell. However, as is obvious, a DRAM cell has a structure that is completely different from that of an NROM™ cell, and, in particular, there is no bitline oxide that has to be etched to provide a bitline contact.

U.S. Pat. No. 5,915,203 to Sengupta et al. discloses a method of producing deep submicron vias, wherein a blanket layer is formed on a dielectric layer and, then, photolithographically patterned. Subsequently, another dielectric layer is deposited and planarized, another blanket layer is deposited and photolithographically patterned so as to form via contacts.

Moreover, U.S. Pat. No. 5,815,433 to Takeuchi discloses a mask ROM device having a redundant circuit portion that is made of an MNOS structure acting as an EEPROM.

SUMMARY OF THE INVENTION

It is accordingly an object of the invention to provide a method for providing bitline contacts in a memory cell array and a memory cell array having bitline contacts that overcome the hereinafore-mentioned disadvantages of the heretofore-known devices and methods of this general type and that provides an improved method for providing bitline contacts in a memory cell array such as an NROM™ chip and, moreover, provides an improved memory cell array as well as an improved NROM™ chip.

With the foregoing and other objects in view, there is provided, in accordance with the invention, a method for providing bitline contacts in a memory cell array, including the steps of disposing a plurality of bitlines in a first direction, covering the bitlines with an isolating layer, disposing a plurality of wordlines in a second direction crossing the first direction above the bitlines, disposing memory cells where the bitlines and wordlines cross one another, removing the isolating layer from the bitlines at portions not covered by the wordlines with areas between the bitlines remaining unaffected, and providing an electrical conductive material on exposed portions of the bitlines.

With the objects of the invention in view, there is also provided a method for providing bitline contacts in a memory cell array, including the steps of disposing a plurality of bitlines in a first direction on a substrate, disposing a plurality of wordlines in a second direction crossing the first direction above the bitlines on the substrate, disposing memory cells where the bitlines and wordlines cross one another, the memory cells forming a memory cell array, covering the bitlines with a first isolating layer, covering, with at least one second isolating layer, all portions of the memory cell array between the bitlines not covered by the wordlines, removing the first isolating layer from the bitlines by a step in which also a topmost of the at least one second isolating layer is removed from the memory cell array at portions not covered by the wordlines, and providing an electrical conductive material on exposed portions of the bitlines.

In addition, the present invention provides a method of fabricating a nitride read only memory (NROM) chip, including the steps of providing a memory cell array in which a plurality of memory cells are disposed at the points at which a plurality of bitlines, which are covered by an isolating layer, disposed in a first direction and a plurality of wordlines disposed in a second direction perpendicular to the first direction cross each other, each of the memory cells being composed of a metal-insulator-semiconductor field effect transistor wherein the insulator is an oxide-nitride-oxide multi-layer stack for storing one or more injected electrons, providing a peripheral portion including logic components, providing bitline contacts by the methods as defined above, for accomplishing electrical contact between the bitlines and metal lines to be formed in a following step, and providing metal lines disposed in a first direction above the bitlines.

Moreover, the present invention provides a memory cell array as well as a nitride read only memory (NROM™) chip having bitline contacts produced by the methods as defined above, respectively.

In accordance with a first mode of the invention, the isolating layer is completely removed from the bitlines at the portions that are not covered by the wordlines whereas the areas between the bitlines remain unaffected. This is in contrast to the known methods in which the isolating layer is only partially removed at those portions that are photolithographically defined by a hole mask.

Therefore, in accordance with a further mode of the invention, a mask having a stripe pattern and, in particular, the bitline mask for defining the bitlines, can be used for patterning the photoresist material coated onto the memory cell array. However, the alignment of a mask having a stripe pattern is much easier than the alignment of a mask having a hole pattern. As a consequence, the present invention provides a method by which a misalignment is avoided and the bitline oxide is exactly removed from the bitlines.

In accordance with a second mode of the invention, the isolating layer is completely removed from the memory cell array at those portions that are not covered by the wordlines. This is in contrast to the known methods in which the isolating layer is only partially removed at those portions that are photolithographically defined by a hole mask.

In accordance with an additional mode of the invention, the step of removing the isolating layer from the bitlines is carried out by depositing a photoresist material, patterning the photoresist material using a mask having a stripe pattern, and selectively etching the isolating layer with respect to the wordlines.

In accordance with yet another mode of the invention, the mask having the stripe pattern is provided as the bitline mask by which the bitlines have been defined.

As a consequence, photolithography is only necessary for masking the logic components in the peripheral portion of the memory chip so that they are not etched. To such an end, the mask for defining the memory cell array can be used for lithography. However, as is apparent, such a mask is much easier to handle and to adjust than a mask having a hole or a stripe pattern. Accordingly, the removal of the bitline oxide is no longer a critical step.

In accordance with yet a further mode of the invention, the step of removing the first isolating layer is carried out by time-controlled etching of the first isolating layer selectively with respect to the wordlines. The step of removing the bitline oxide is performed time-controlled so that the underlying bitline is not attacked by this step.

Moreover, according to a preferred embodiment relating to both aspects of the present invention, the electrical conductive material is provided on the exposed portions of the bitlines by an inverse poly etching process, in which, first, doped polysilicon is deposited over the whole cell array and, then, the doped polysilicon is removed from the areas between the bitlines. To such an end, the doped polysilicon is, advantageously, covered by a photoresist material that is, then, patterned using a mask having a stripe pattern.

Such an inverse poly etching process is particularly advantageous because, in contrast to known methods, in which contact holes are etched into an isolating material, the polysilicon is only removed at the areas between the bitlines. Therefore, according to this embodiment of the present invention, a self-aligned contact etch is not performed, and the spacer and cap nitride on the gate electrodes are not attacked, whereby shorts between bitlines and wordlines are avoided. In addition, the aspect ratio of the bitline contacts can be increased. As a consequence, the thickness of the spacers on the wordlines can be increased.

In particular, when the present invention is applied to a nitride read only memory cell array, the increased thickness of the spacer is highly advantageous because the gate electrodes in these cell arrays have to withstand much higher voltages than, for example, in DRAM cell arrays.

For removing the doped polysilicon, a mask having a stripe pattern is used. However, the alignment of such a mask is much easier than the alignment of a mask having a hole pattern. As a consequence, a misalignment of the mask can be largely avoided and an overlay mistake does not occur.

According to a preferred embodiment of the second aspect of the present invention, the step of etching the electrical conductive material in the exposed regions is performed as an over-etching step so that part of the substrate under the electrical conductive material is also removed. By a following step of filling an isolating material such as boron phosphorous silicate glass, neighboring bitlines are electrically isolated from each other. Thus, a self-aligned shallow trench isolation (STI) is performed that is highly advantageous due to the smaller cell size required with respect to conventional STI procedures.

The memory cell array as well as the nitride read only memory cell array of the first aspect of present invention are different from the known memory cell arrays and nitride read only memory cell arrays, respectively, because the bitlines are electrically connected with overlying metal lines through conducting bitlines at each of the memory cells. Due to the special manufacturing method including the inverse poly etching process of the present invention, the bitline contacts are not formed at every 3rd or 4th memory cell as is the case when the conventional SAC process using a contact hole mask is applied, but the bitline contacts are formed at every memory cell.

The memory cell array as well as the nitride read only memory cell array of the second aspect of the present invention are different from the known memory cell arrays and nitride read only memory cell arrays, respectively, because bitline oxide is completely removed from the bitlines at those portions that are not covered by the wordlines. In contrast, in the known memory cell arrays, the bitline oxide is removed at every 3rd or 4th memory cell, at those portions, at which by the conventional SAC process using a contact hole mask the contact holes are defined.

The memory cell array as well as the nitride read only memory cell array of the present invention are especially advantageous with respect to the known ones because they exhibit an improved resistance to shorts between wordlines and bitlines due to their increased spacer thickness.

The method for providing bitline contacts in a memory cell array can be applied to any cell type in which the bitline is covered by an isolating layer such as a bitline oxide. Typical cell types to which the present invention can be applied include ROM and EPROM cells.

In accordance with yet an added mode of the invention, the step of providing the electrical conductive material on the exposed portions of the bitlines is carried out by depositing an isolating material onto the memory cell array, coating a photoresist material and lithographically defining contact holes in the photoresist material, etching the isolating material to create the contact holes, and depositing the electrical conductive material to fill the contact holes with the electrical conductive material.

In accordance with yet an additional mode of the invention, the step of providing the electrical conductive material on the exposed portions of the bitlines is carried out by depositing the electrical conductive material onto the memory cell array, removing the electrical conductive material from areas between the bitlines, and depositing an isolating material in the areas between the bitlines.

In accordance with again another mode of the invention, the step of removing the electrical conductive material from the areas between the bitlines is carried out by coating a photoresist material on the electrical conductive material and lithographically defining regions where the electrical conductive material is to be removed using a mask having a stripe pattern and removing the electrical conductive material in the exposed regions.

In accordance with again a further mode of the invention, the step of providing the electrical conductive material on the exposed portions of the bitlines is carried out by depositing the electrical conductive material onto the memory cell array, removing the electrical conductive material from areas between the bitlines, and depositing an isolating material in the areas between the bitlines.

In accordance with again an added mode of the invention, the first isolating layer is removed from the bitlines to expose the substrate at the portions between the bitlines not covered by the wordlines, and the step of etching the electrical conductive material is performed as an over-etching step to remove part of the substrate under the electrical conductive material.

In accordance with again an additional mode of the invention, the isolating material depositing step is carried out by depositing, in the areas between the bitlines, a silicate glass doped with at least one of boron and phosphorous.

In accordance with a concomitant feature of the invention, the electrical conductive material providing step is carried out by providing doped polysilicon on exposed portions of the bitlines.

Other features that are considered as characteristic for the invention are set forth in the appended claims.

Although the invention is illustrated and described herein as embodied in a method for providing bitline contacts in a memory cell array and a memory cell array having bitline contacts, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

The following description of the preferred embodiments of the present invention will mainly focus on the process of manufacturing an NROM™ memory cell array, in which substantially the steps of creating the memory cell components are described whereas the definition of the peripheral parts of the memory cell array including logic components is only schematically outlined. As is clearly to be understood, the peripheral parts of the memory cell array are manufactured by generally known methods.

Reference is now made to the figures of the drawings in detail and first, particularly to FIGS. 3 to 5C.

First, isolation trenches 21 for a standard shallow trench isolation (STI) are etched in a substrate 1, for example of p-doped silicon, and, subsequently are filled with an isolating material such as silicon dioxide. These isolation trenches are provided at a distance corresponding to the distance of approximately 64 bitlines, which are to be defined later, and they are used for separating larger cell areas.

Figure 3:
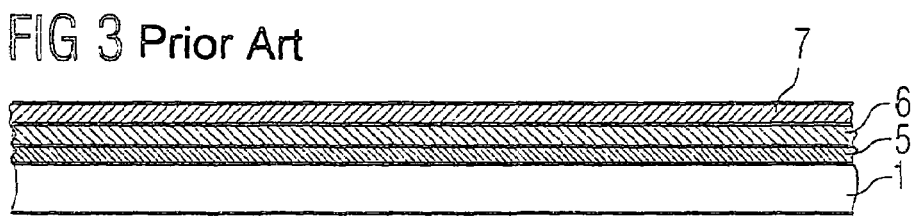
FIG. 3 is a fragmentary, cross-sectional view illustrating a step for preparing an NROM™ memory cell array according to known methods.

Then, an ONO multi-layer including a 5 nm to 15 nm $SiO_2$ layer 5, a 2 to 15 nm $Si_3N_4$ layer 6 and a 5 to 15 nm $SiO_2$ layer 7 is deposited by conventional processes on a semiconductor substrate 1, for example of p-doped silicon, so that the entire substrate is covered with an ONO multi-layer as is shown in FIG. 3.

Figure 1:
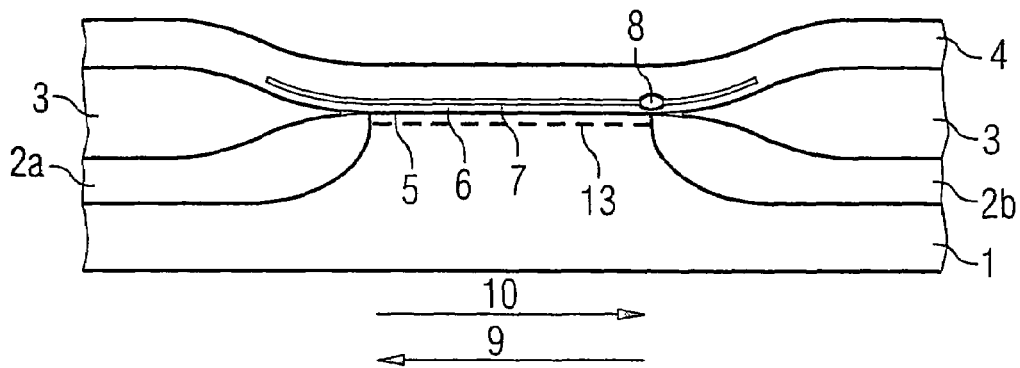
FIG. 1 is a fragmentary cross-sectional view of a prior art NROM™ memory cell.
Figure 4A:
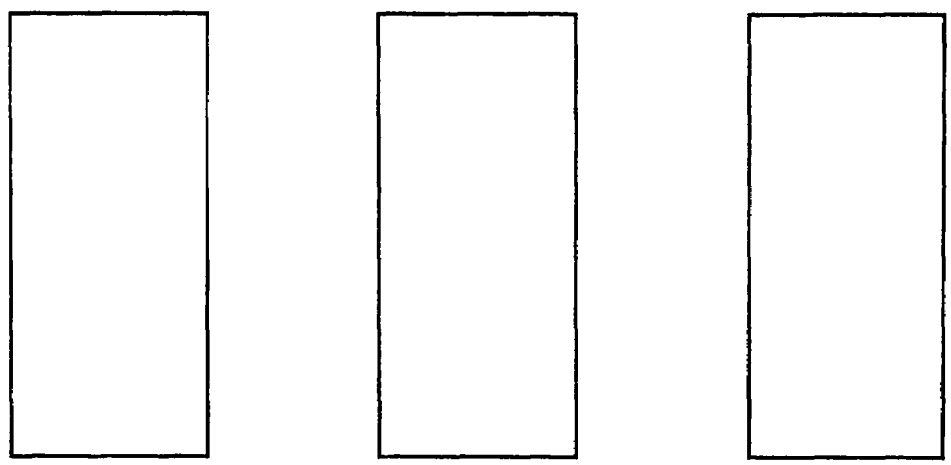
FIG. 4A is a fragmentary, plan view of a bitline mask layout for preparing an NROM™ memory cell array according to known methods.
Figure 4B:
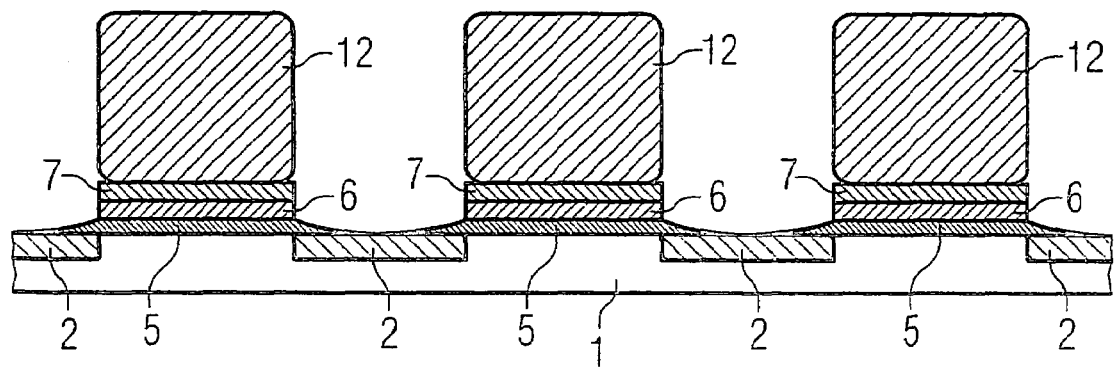
FIG. 4B is a fragmentary, cross-sectional view illustrating photoresist columns for preparing the NROM™ memory cell array according to known methods.
Figure 4C:
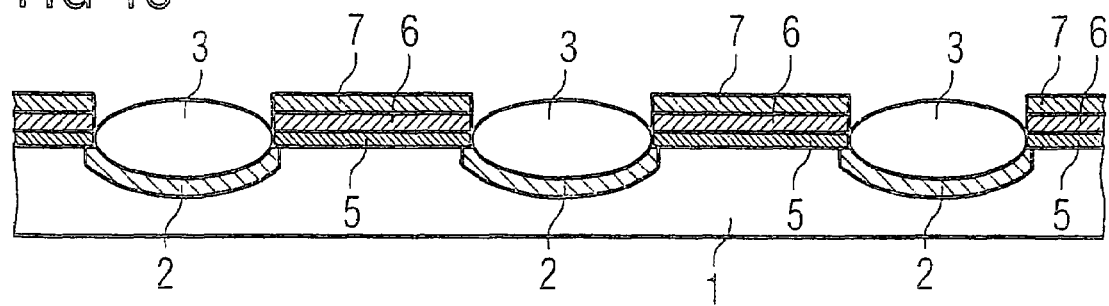
FIG. 4C is a fragmentary, cross-sectional view of a memory cell in the process for preparing the NROM™ memory cell array according to known methods.

Thereafter, a bitline mask that is typically photoresist patterned in a well-known manner is deposited on the substrate to create the bitlines, forming lines of source electrodes and lines of drain electrodes. The layout of the bitline mask within the memory cell array portion of the chip is shown in FIG. 4A. As is shown in FIG. 4B, the photoresist columns 12 define the areas where the bitlines 2 are not to be implanted. Accordingly, they are disposed at the channel regions 13 of the transistors as is shown in FIG. 1. FIG. 4C shows a cross-section of the memory cell having the implanted bitlines.

Next, the top oxide 7 and the nitride layer 6 are etched from the regions between the photoresist columns 12, typically by a dry etching process. Thereafter, the bitlines 2 are implanted in the areas between the photoresist columns 12 with an n-dopant. By such process, the bitlines 2 are implanted in a self-aligned manner with respect to the photoresist columns 12.

Then, the photoresist columns 12 are removed, the ONO multi-layer is removed from the peripheral parts of the chip and a thermal oxidation process is performed. Thereby, bitline oxides 3 are thermally grown over the bitlines 2. Because the growth rate is much higher on the highly doped bitlines than on the nitride and oxide layers 6, 7, a thick layer of silicon dioxide is grown over the bitlines, whereas a thin layer of silicon dioxide is grown along the sides of the nitride layer 6 and a thin layer of silicon dioxide is grown over the oxide layer 7. Moreover, a silicon dioxide layer acting as a gate-isolating layer is grown in the peripheral portion of the chip.

A bitline oxide thickness of 20 to 70 nm is considered appropriate. FIG. 4C shows a cross-sectional view of the resulting structure.

Figure 2:
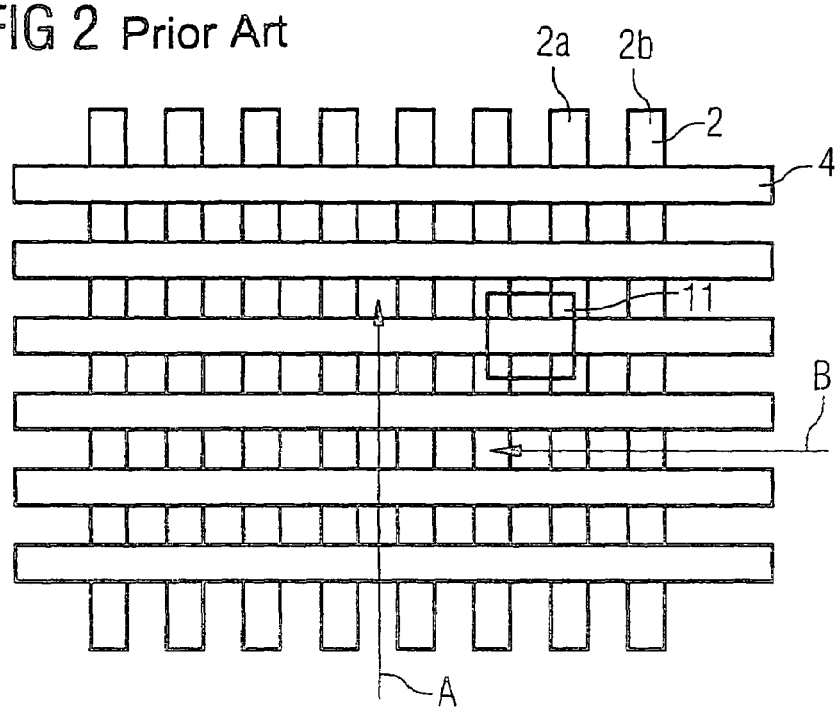
FIG. 2 is a fragmentary plan view of an exemplary prior art memory cell array to which the present invention can be applied.

Then, a polysilicon layer that will create wordlines of the memory cell array portion and will create gates for the peripheral transistors is laid down over the chip. In the next step, a low resistive silicide, for example, tungsten silicide, is deposited over the polysilicon layer so as to form a polycide layer having a reduced resistance. A typical total thickness of the polycide layer amounts to 100 to 200 nm. As shown in FIG. 2 the polycide layer is, then, etched using a mask. Thereby, wordlines 4 are defined within the memory cell array, whereas gate electrodes are defined in the peripheral portion.

This etching step can be performed so that also at least the top oxide layer 7 and the nitride layer 6 are etched from between the word lines 4. As a result, only the bottom oxide layer 5 will remain in these areas. When implementing the second aspect of the present invention, the bottom oxide layer 5 will be etched in the step of etching the bitline oxide to be performed later. This is especially useful if a self-aligned shallow trench isolation is to be provided during the inverse poly etch process.

As an alternative, the step of etching the wordlines can also be performed so that the top oxide layer 7 and the nitride layer 6 are not attacked. In such a case, when implementing the second aspect of the invention, the top oxide layer 7 will be etched in the step of etching the bitline oxide to be performed later, and the nitride layer 6 will act as an etch stop in the inverse poly etch process. Accordingly, with this wordline etching step, a self-aligned shallow trench isolation, as will be explained later, will not be possible.

The resultant memory cell structure is shown in FIG. 1. The polycide layer 4 lies on top of the ONO multi-layers, thereby forming the gates of the NROM™ cells. The bitline oxides 3 are thick enough to isolate neighboring ONO multi-layers.

Thereafter, a side wall oxidation step for the wordlines 4, a lightly doped drain (LDD) implant procedure into the CMOS periphery only and a spacer 15 deposition are performed. The LDD typically requires separate masks for the n-channel and p-channel peripheral transistors.

In NROM™ cells, the nitride spacer on the gate electrode should be thicker than the nitride spacer thickness of DRAM or embedded DRAM cells because they have to withstand a higher voltage due to the higher voltage applied to the gate electrodes. It is estimated that the spacer thickness should exceed 40 nm.

After forming this spacer, a nitride liner as well as a thick silicon dioxide spacer are deposited over the whole chip area. The thick silicon dioxide spacer that is formed by a chemical vapor deposition process using tetraethylorthosilicate (TEOS) is used for the transistors built in the peripheral portion. Thereafter, the thick silicon dioxide spacer is removed from the memory cell portion of the chip.

In the next step, the process of the present invention will be performed so as to define the bitline contacts for contacting the bitlines with metal lines that are to be formed later.

Figure 5A:
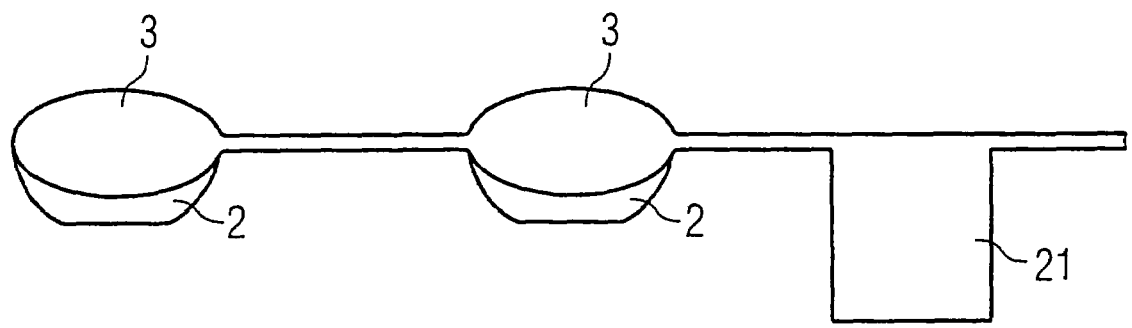
FIG. 5A is a fragmentary, cross-sectional view of the memory cell array along direction A in FIG. 2 before carrying out the methods of the present invention.
Figure 5B:
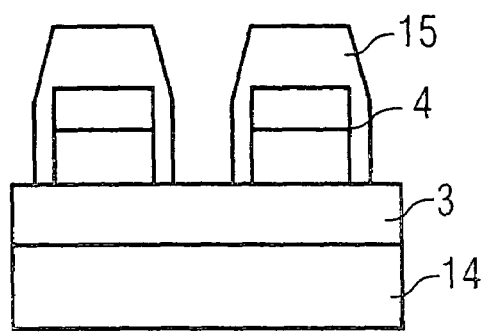
FIG. 5B is a fragmentary, cross-sectional view of the memory cell array along direction B in FIG. 2 before carrying out the methods of the present invention.
Figure 5C:
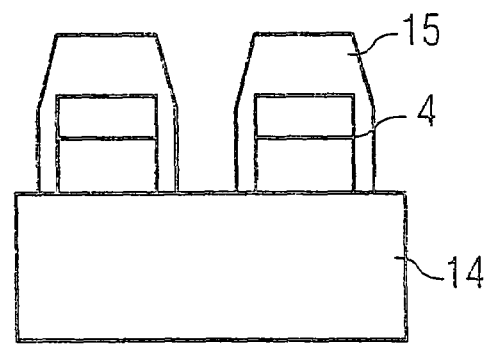
FIG. 5C is a fragmentary, cross-sectional of the logic devices disposed in the peripheral part of the chip before carrying out the methods of the present invention.

FIG. 5A shows a cross-sectional view of the memory cell array along direction A as defined in FIG. 2, whereas FIG. 5B shows a cross-sectional view of the memory cell array along direction B as defined in FIG. 2. Reference numeral 14 denotes the active areas of the memory cell array, and reference numeral 21 denotes an isolation trench filled with silicon dioxide that is used for separating larger cell areas. These isolation trenches 21 that are disposed every 64 bitlines were produced during the shallow trench isolation as explained above. For sake of simplicity, the isolation trenches 21 will be omitted from the following Figures. FIG. 5C shows a cross-sectional view of the logic devices disposed in the peripheral part of the chip.

The nitride liner that was deposited after forming the nitride spacer may be completely or partially removed at those locations at which the bitline oxide is to be etched.

Figure 6A:
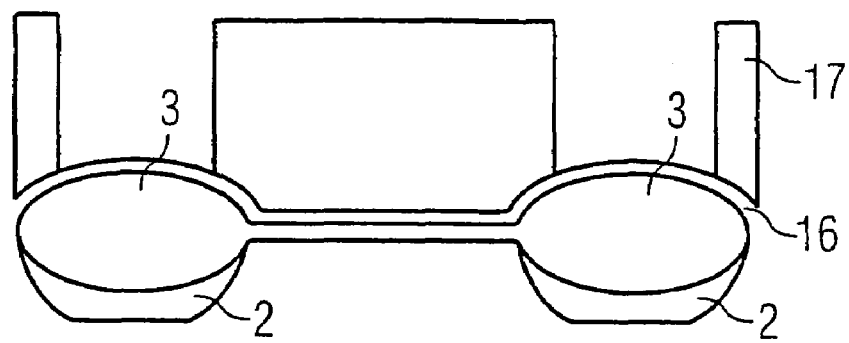
FIG. 6A is a fragmentary, cross-sectional view of the resultant memory cell array along direction A in FIG. 2 in a step for removing the bitline oxide in the method for providing a bitline contact according to a first aspect of the present invention.
Figure 6B:
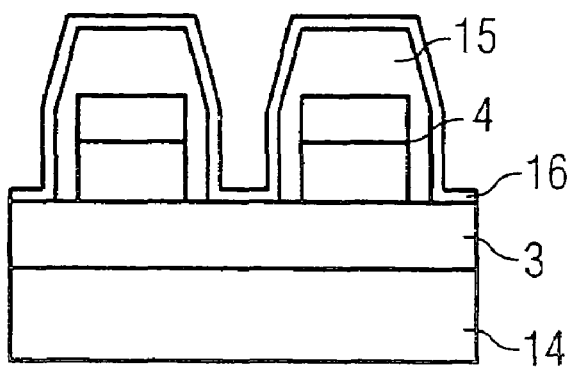
FIG. 6B is a fragmentary, cross-sectional view of the resultant memory cell array along direction B in FIG. 2 in a step for removing the bitline oxide in the method for providing a bitline contact according to the first aspect of the present invention.

For carrying out the first aspect of the present invention, first, a thin silicon dioxide layer 16 having a thickness of approximately 10 to 25 nm is deposited over the whole chip (FIG. 6B). As an alternative, if the nitride liner has only partially been removed, the step of depositing a thin silicon dioxide layer can also be omitted.

Then, a photoresist material 17 (FIG. 6C) is coated onto the whole chip and it is patterned using the bitline implantation mask as shown in FIG. 4A. As a result, the photoresist is removed in those portions at which originally the bitlines 2 were defined, whereas in the remaining areas between the bitlines 2 the photoresist material remains. As can be seen from FIG. 6A that shows a cross-sectional view of the resultant memory cell array along direction A as defined in FIG. 2, the portions at which the photoresist material is removed have a more narrow width than the bitlines 2 that is due to the impurity diffusion during the thermal steps performed before. Accordingly, the misalignment that occurs when laying the bitline mask over the photoresist layer is smaller than the broadening of the bitlines due to impurity diffusion. As a consequence, the portions at which the photoresist material is removed lie exactly above the bitlines and not between them so as to make sure that exactly the bitline oxide will be removed in the next steps.

Figure 6C:
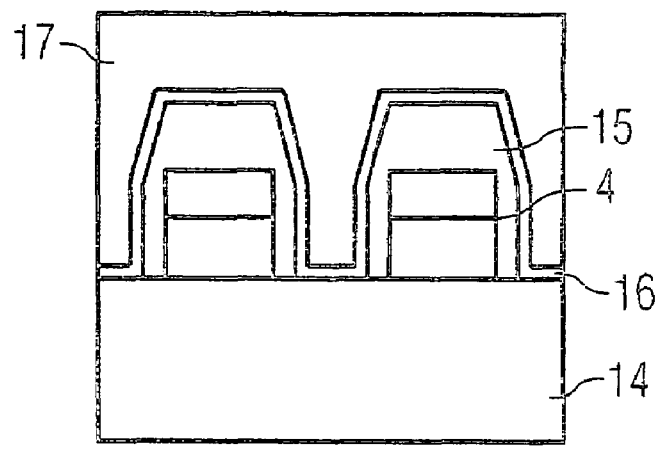
FIG. 6C is a fragmentary, cross-sectional view of the logic devices disposed in the peripheral portion of the chip in a step for removing the bitline oxide in the method for providing a bitline contact according to the first aspect of the present invention.

As can be seen from FIG. 6B that shows a cross-sectional view of the resultant memory cell array along direction B as defined in FIG. 2, the photoresist material is completely removed from the wordlines 4 in the bitline areas. As shown in FIG. 6C that shows a cross-sectional view of the logic devices disposed in the peripheral portion of the chip, the peripheral portion is completely protected by the photoresist material.

In the next step, the silicon dioxide is selectively etched with respect to silicon. To avoid that the nitride spacer of the gate electrodes will be attacked, it is important that the silicon dioxide is etched selectively with respect to silicon nitride. Because the silicon dioxide is selectively etched with respect to silicon, the implanted bitlines will not be substantially attacked by this etching process. Thereafter, the photoresist material is completely removed.

Figure 7A:
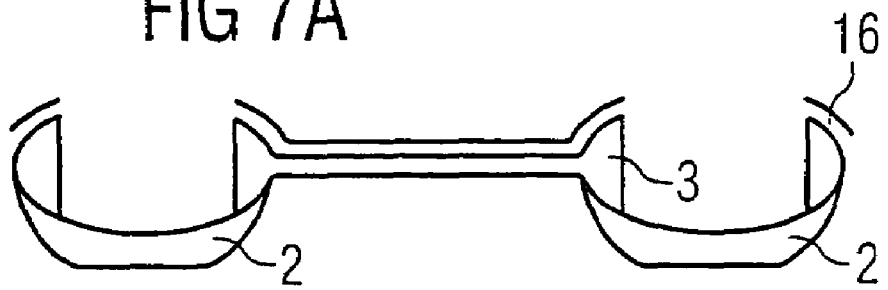
FIG. 7A is a fragmentary, cross-sectional view of the resultant memory cell array along direction A in FIG. 2, at the portions at which the photoresist material has been removed in FIG. 6A in a step for removing the bitline oxide in the method for providing a bitline contact according to the first aspect of the present invention.

As a result, the silicon dioxide is removed in those portions at which originally the bitlines 2 were defined, whereas the areas between the bitlines 2 remain unaffected. As can be seen from FIG. 7A that shows a cross-sectional view of the resultant memory cell array along direction A as defined in FIG. 2, at the portions at which the photoresist material has been removed in FIG. 6A, the silicon dioxide now is removed, thus creating the contact holes for the bitline contacts.

Figure 7B:
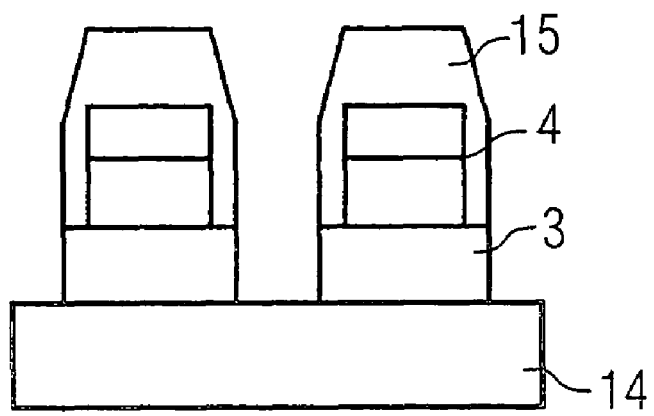
FIG. 7B is a fragmentary, cross-sectional view of the resultant memory cell array along direction B in FIG. 2 in a step for removing the bitline oxide in the method for providing a bitline contact according to the first aspect of the present invention.

As shown in FIG. 7B that shows a cross-sectional view of the resultant memory cell array along direction B as defined in FIG. 2, the bitline oxide 3 between adjacent wordlines now is completely removed in the bitline areas. Because the bitline oxide was etched selectively with respect to silicon nitride and, in addition, the wordlines were covered by an isolating layer such as made of silicon dioxide before depositing the photoresist material, the spacer on the wordlines is not attacked by this etching step.

Figure 7C:
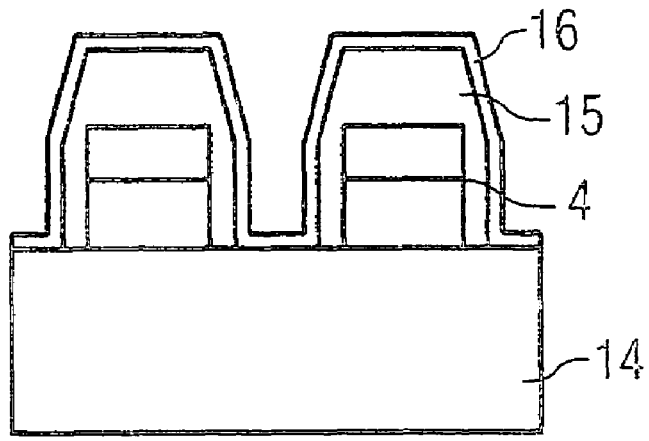
FIG. 7C is a fragmentary, cross-sectional view of the logic devices disposed in the peripheral part of the chip in a step for removing the bitline oxide in the method for providing a bitline contact according to the first aspect of the present invention.

As shown in FIG. 7C that shows a cross-sectional view of the logic devices disposed in the peripheral part of the chip, the silicon dioxide layer remains over the wordlines in this area.

As a further modification of the described process steps, the spacer of the gate electrodes may as well be formed of silicon dioxide if the silicon nitride liner that is deposited thereafter is not removed from these areas. Accordingly, the silicon nitride liner protects the underlying silicon dioxide spacer from etching. Because silicon dioxide has a higher resistance to breakthrough, the use of a silicon dioxide spacer is highly advantageous.

In the next steps, an electrical conductive material will be provided on the exposed portions of the bitlines. This can be done by a conventional process, which provides self-aligned contacts as was outlined above, or, according to a preferred embodiment of the present invention, by a so-called inverse poly etch as will be explained later.

For providing the electrical conductive material in the contact hole by a conventional process, first, a silicon oxynitride liner followed by a boron phosphorous silicate glass (BPSG) is deposited over the entire chip area. Thereafter, a silicon dioxide layer is deposited by a chemical vapor deposition process using TEOS (tetraethylorthosilicate). In such a layer stack, the contact holes will be etched.

Then, a photoresist material is coated and the contact holes for contacting the bitlines are lithographically defined using a contact hole mask. The contact hole mask is configured so that every 3rd or 4th memory cell is connected with the metal lines that are to be formed later. After defining the contact holes in the photoresist layer, the silicon dioxide layer as well as the BPSG material are selectively etched, for example, by dry etching with $C_4F_8$ or $C_5F_8$.

In a following step, the photoresist material is removed from the cell area and, optionally, an ion implantation step with arsenic ions is performed so as to reduce the contact resistance.

In the next step, an electrical conductive material such as $n^+$-doped polysilicon is deposited so as to fill the contact holes. Then, the polysilicon on the chip surface is recessed, for example, by wet etching or plasma etching using the BPSG layer as an etch stop layer. Thereafter, the metal lines will be formed in a manner that will be described later.

According to a preferred embodiment of the present invention, the electrical conductive material can also be filled into the contact holes by a so-called inverse poly etch process in which a doped polysilicon layer is deposited over the whole chip area, and this polysilicon layer is removed from those portions at which no contact is to be made.

Figure 8A:
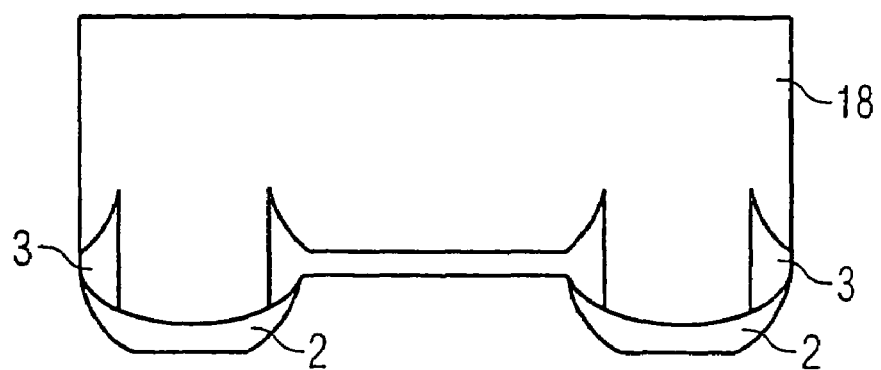
FIG. 8A is a fragmentary, cross-sectional view of the memory cell array along direction A in FIG. 2 in a step for providing an electrical conductive material in the method for providing a bitline contact according to the first aspect of the present invention.
Figure 8B:
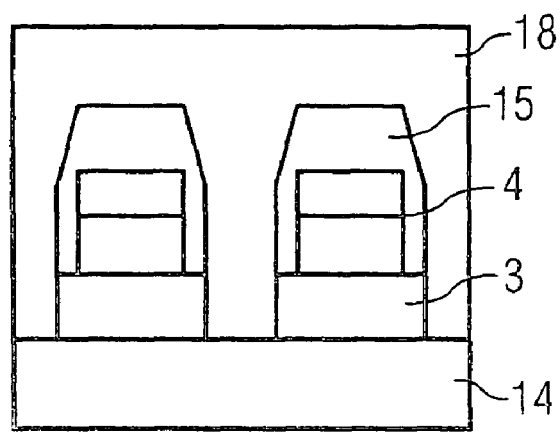
FIG. 8B is a fragmentary, cross-sectional view of the memory cell array along direction B in FIG. 2 in a step for providing an electrical conductive material in the method for providing a bitline contact according to the first aspect of the present invention.
Figure 8C:
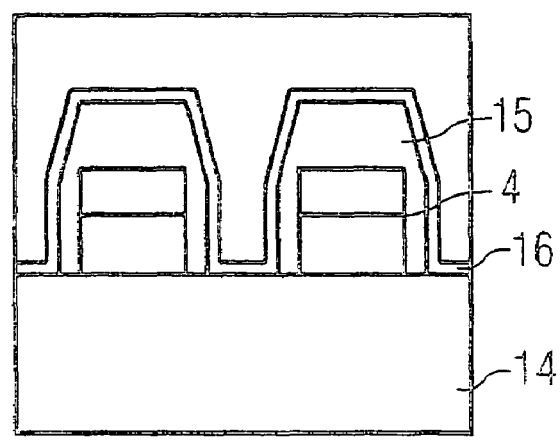
FIG. 8C is a fragmentary, cross-sectional view of the logic devices disposed in the peripheral portion of the chip in a step for providing an electrical conductive material in the method for providing a bitline contact according to the first aspect of the present invention.

First, a wet cleaning process is performed to remove silicon dioxide residues as well as a native oxide from the silicon surface so that the doped polysilicon layer will be directly deposited on the silicon surface. Thereafter, a highly n-doped polysilicon layer 18 is deposited so as to cover the whole chip area. Next, a chemical mechanical polishing step with a target of approximately 100 nm above the nitride cap of the wordline is performed. The resulting structure is shown in FIGS. 8A to 8C, wherein FIG. 8A shows a cross-sectional view of the memory cell array along direction A as defined in FIG. 2, FIG. 8B shows a cross-sectional view of the memory cell array along direction B as defined in FIG. 2, and FIG. 8C shows a cross-sectional view of the logic devices disposed in the peripheral portion of the chip.

Thereafter, a hardmask layer 19 of silicon nitride having a thickness of approximately 200 nm is deposited, and a non-illustrated photoresist material is coated. Using a mask having a stripe pattern, for example a mask similar to that shown in FIG. 4A, the photoresist material is patterned so that in the resulting photoresist pattern the areas between the bitlines 2 are exposed. The mask having a stripe pattern can, for example, be generated using the bitline mask. Then, in the exposed areas between the bitlines 2, the hardmask layer 19 is removed and the $n^+$-doped polysilicon 18 is removed by etching. In a following step, the photoresist material will be removed.

Figure 9A:
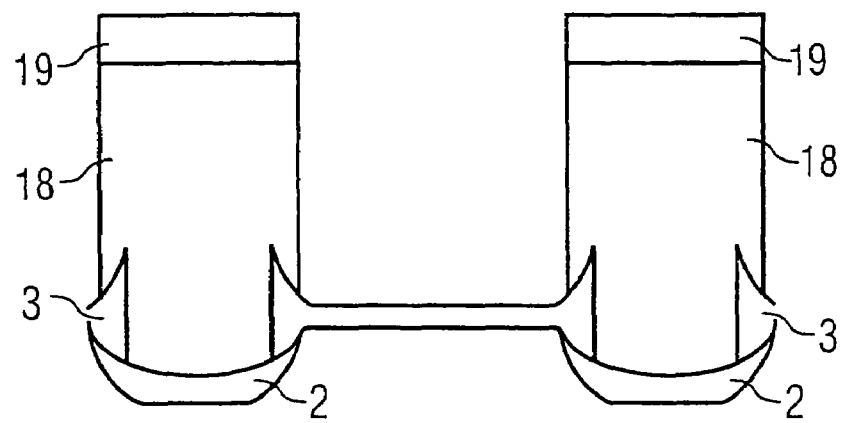
FIG. 9A is a fragmentary, cross-sectional view of the memory cell array along direction A in FIG. 2 in a step for providing an electrical conductive material in the method for providing a bitline contact according to the first aspect of the present invention.
Figure 9B:
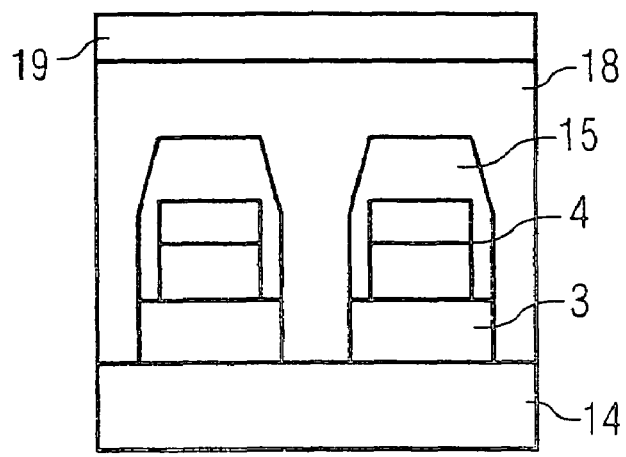
FIG. 9B is a fragmentary, cross-sectional view of the memory cell array along direction B in FIG. 2 in a step for providing an electrical conductive material in the method for providing a bitline contact according to the first aspect of the present invention.
Figure 9C:
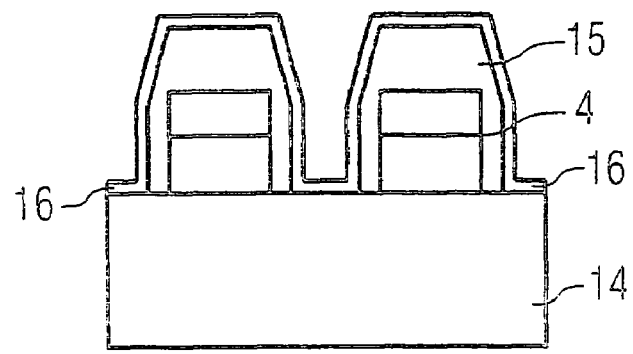
FIG. 9C is a fragmentary, cross-sectional view of the logic devices disposed in the peripheral part of the chip in a step for providing an electrical conductive material in the method for providing a bitline contact according to the first aspect of the present invention.

After removing the photoresist material, a structure as shown in FIGS. 9A to 9C is obtained, wherein FIG. 9A shows a cross-sectional view of the memory cell array along direction A as defined in FIG. 2, FIG. 9B shows a cross-sectional view of the memory cell array along direction B as defined in FIG. 2, and FIG. 9C shows a cross-sectional view of the logic devices disposed in the peripheral part of the chip. As can be clearly seen from FIGS. 9A and 9B, the polysilicon 18 remains only at those portions above the bitlines 2, whereas it is completely removed over the logic components in FIG. 9C. Because a thin silicon dioxide layer 16 was deposited before removing the bitline oxide, the peripheral portion is protected from etching.

Figure 10A:
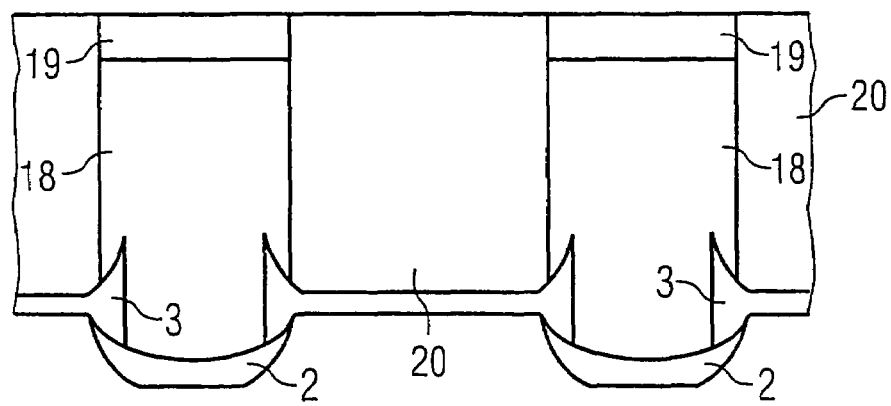
FIG. 10A is a fragmentary, cross-sectional view of the memory cell array along direction A in FIG. 2 in a step for providing an electrical conductive material in the method for providing a bitline contact according to the first aspect of the present invention.
Figure 10B:
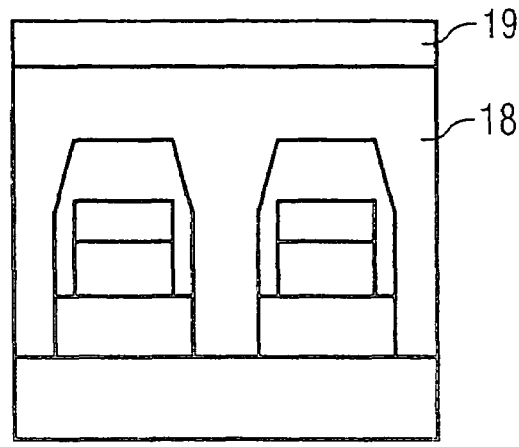
FIG. 10B is a fragmentary, cross-sectional view of the memory cell array along direction B in FIG. 2 in a step for providing an electrical conductive material in the method for providing a bitline contact according to the first aspect of the present invention.
Figure 10C:
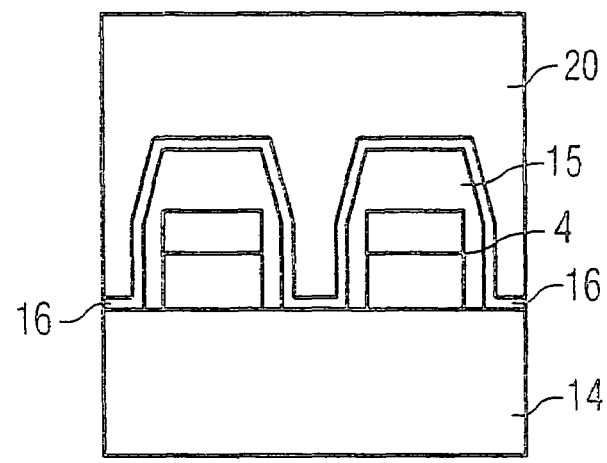
FIG. 10C is a fragmentary, cross-sectional view of the logic devices disposed in the peripheral part of the chip in a step for providing an electrical conductive material in the method for providing a bitline contact according to the first aspect of the present invention.

Thereafter, a boron phosphorous-doped silicate glass (BPSG) layer 20 is deposited over the entire chip area and it is planarized using chemical mechanical polishing using the silicon nitride hardmask as a polish stop. The resultant structure is shown in FIGS. 10A to 10C, wherein FIG. 10A shows a cross-sectional view of the memory cell array along direction A as defined in FIG. 2, FIG. 10B shows a cross-sectional view of the memory cell array along direction B as defined in FIG. 2, and FIG. 10C shows a cross-sectional view of the logic devices disposed in the peripheral part of the chip.

Accordingly, the bitline contacts are completed by providing an electrical conductive material by a method in which, first, the material is deposited over the whole chip area and, then, it is removed from the areas at which a contact is not to be made. As a consequence, a self-aligned etching step in which the wordlines act as an etching mask and, thus, could be attacked, does not occur. Because the etching step is not self-aligned, the width between the word lines can be further reduced so that the thickness of the spacers on the gate electrodes can be increased. As a consequence, shorts between wordlines and bitline contacts can be largely avoided whereby the device performance is greatly improved.

After removing the silicon nitride hardmask, the metal lines will be formed. The metal lines can be formed using the so-called damascene technique or any other arbitrary process. For creating the metal lines using the so-called damascene technique, first a silicon dioxide layer is deposited onto the entire chip area by a chemical vapor deposition process using tetraethylorthosilicate. Thereafter, trenches are etched into the silicon dioxide layer using a mask having a stripe pattern, for example, the mask as used for defining the bitline contacts or a similar mask.

Then, a titanium liner and a layer of tungsten are deposited and the trenches are filled with these metals. Finally, the surface is planarized using chemical mechanical polishing or etching back of the metal so that the trenches are completely filled and no metal remains in the spaces between the trenches so that the trenches are electrically isolated from each other.

According to a different process, it is also possible to first deposit a titanium liner and the tungsten material, deposit a photoresist material, lithographically define the metal lines using a mask having a stripe pattern, for example, the bitline mask, etch the metal layers, and deposit silicon dioxide to electrically isolate the metal lines from each other.

Thereafter, the memory chip is completed in a conventional manner.

According to a second aspect of the present invention, the bitline contacts are formed by completely etching the isolating layer from the bitlines as well as from the memory cell array at those portions that are not covered by the wordlines and by providing an electrical conductive material on the exposed portions of the bitlines.

Starting from the memory cell array as shown in FIGS. 5A to 5C, first, a thin silicon dioxide layer 16 as well as a thin silicon nitride layer 22 are deposited over the whole chip. The thicknesses of both layers are selected so that they will not substantially be attacked during the following etching steps. As an alternative, the nitride liner is not removed and, in addition, a thin silicon nitride layer as well as a thin silicon dioxide layer are deposited.

Then, a photoresist material 17 (FIG. 11C) is coated onto the whole chip and it is photolithographically patterned for masking the peripheral portion of the chip. As a result, the photoresist is removed from the whole memory cell array portion of the chip, whereas the photoresist material remains in the peripheral portion thereof.

Figure 11A:
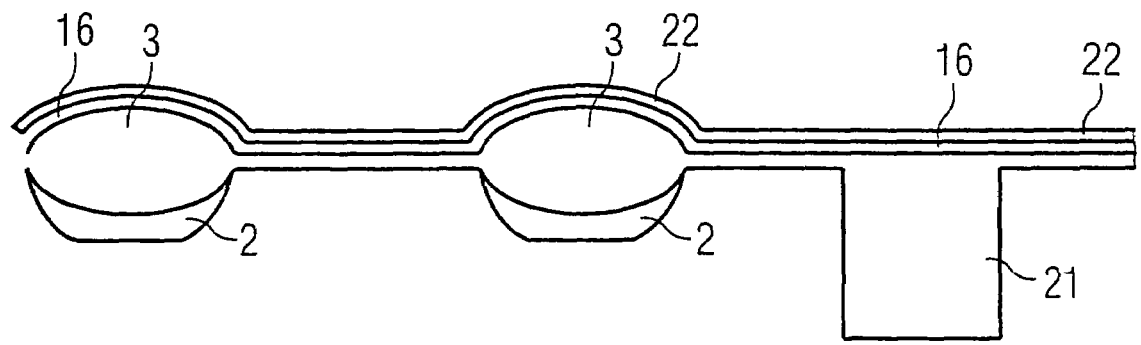
FIG. 11A is a fragmentary, cross-sectional view of the memory cell array along direction A in FIG. 2 in a step for removing the bitline oxide in the method for providing a bitline contact according to a second aspect of the present invention.
Figure 11B:
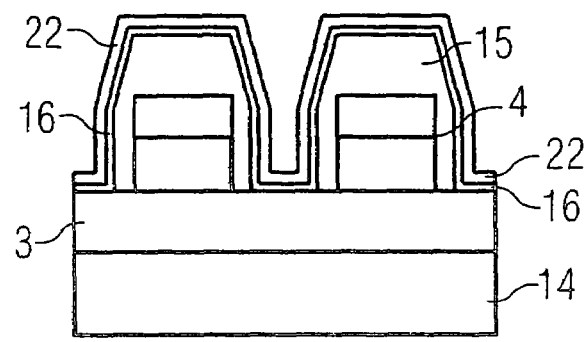
FIG. 11B is a fragmentary, cross-sectional view of the resultant memory cell array along direction B in FIG. 2 in a step for removing the bitline oxide in the method for providing a bitline contact according to the second aspect of the present invention.
Figure 11C:
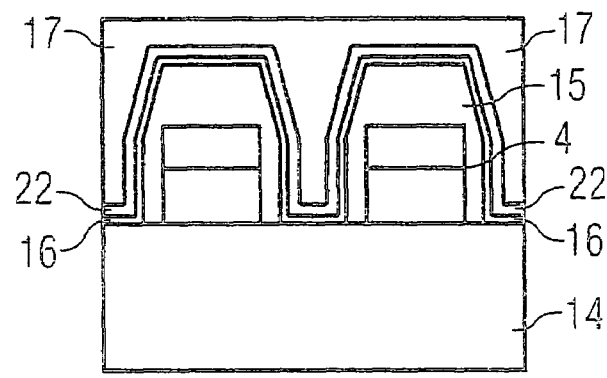
FIG. 11C is a fragmentary, cross-sectional view of the logic devices disposed in the peripheral portion of the chip in a step for removing the bitline oxide in the method for providing a bitline contact according to the second aspect of the present invention.

As can be seen from FIG. 11A that shows a cross-sectional view of the memory cell array along direction A as defined in FIG. 2 as well as from FIG. 11B that shows a cross-sectional view of the resultant memory cell array along direction B as defined in FIG. 2, the photoresist material is completely removed from the memory cell array portion. As shown in FIG. 11C that shows a cross-sectional view of the logic devices disposed in the peripheral portion of the chip, the peripheral portion is completely protected by the photoresist material.

Figure 12A:
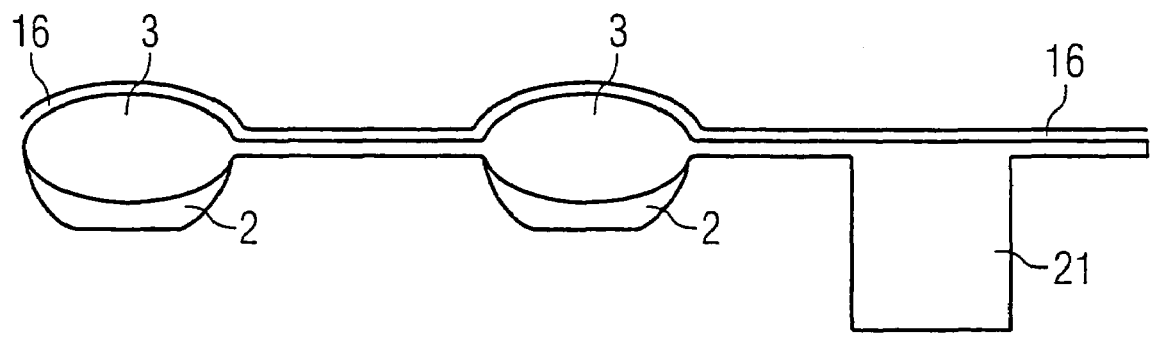
FIG. 12A is a fragmentary, cross-sectional view of the memory cell array along direction A in FIG. 2 in a step for removing the bitline oxide in the method for providing a bitline contact according to a second aspect of the present invention.
Figure 12B:
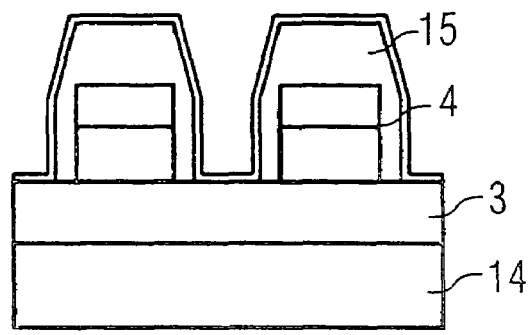
FIG. 12B is a fragmentary, cross-sectional view of the resultant memory cell array along direction B in FIG. 2 in a step for removing the bitline oxide in the method for providing a bitline contact according to the second aspect of the present invention.
Figure 12C:
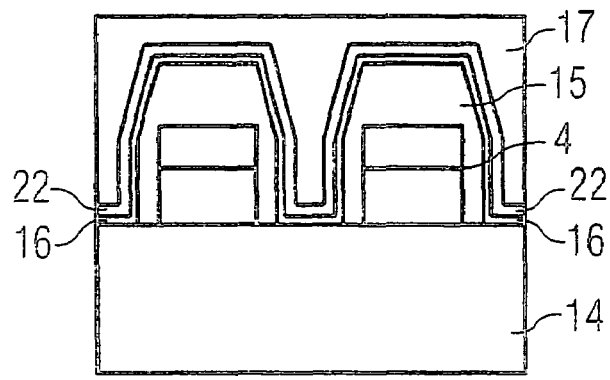
FIG. 12C is a fragmentary, cross-sectional view of the logic devices disposed in the peripheral portion of the chip in a step for removing the bitline oxide in the method for providing a bitline contact according to the second aspect of the present invention.
Figure 13A:
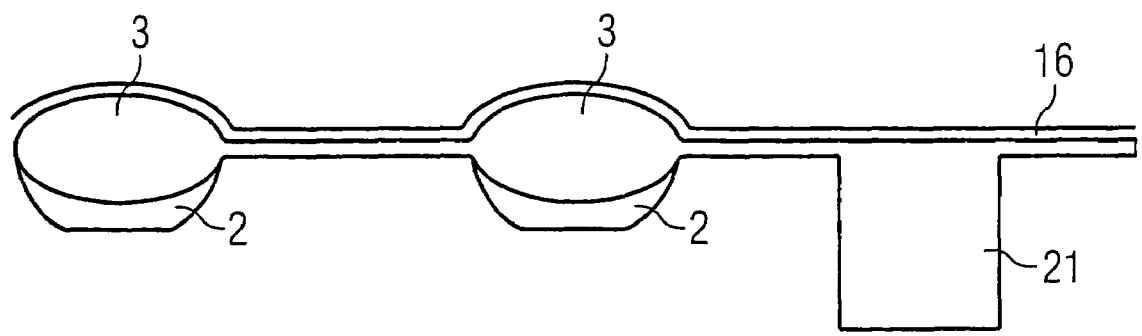
FIG. 13A is a fragmentary, cross-sectional view of the memory cell array along direction A in FIG. 2 in a step for removing the bitline oxide in the method for providing a bitline contact according to a second aspect of the present invention.
Figure 13B:
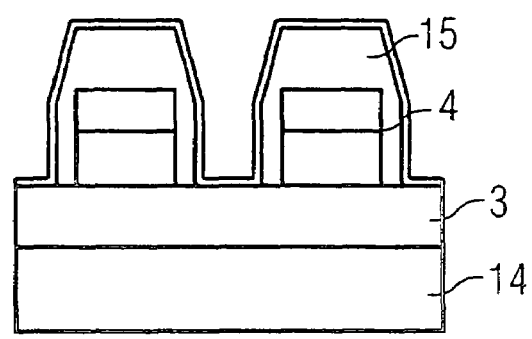
FIG. 13B is a fragmentary, cross-sectional view of the resultant memory cell array along direction B in FIG. 2 in a step for removing the bitline oxide in the method for providing a bitline contact according to the second aspect of the present invention.
Figure 13C:
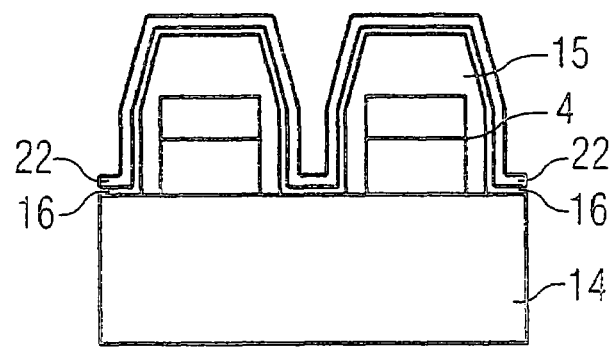
FIG. 13C is a fragmentary, cross-sectional view of the logic devices disposed in the peripheral portion of the chip in a step for removing the bitline oxide in the method for providing a bitline contact according to the second aspect of the present invention.

In a next step, the silicon nitride is etched selectively with respect to the underlying silicon dioxide layer (FIGS. 12A to 12C), and the photoresist material is removed from the whole surface. As a result, the peripheral portion is covered by a thin silicon nitride layer whereas the memory cell array is covered by the thin silicon dioxide layer, as can be seen from FIGS. 13A to 13C.

Figure 14A:
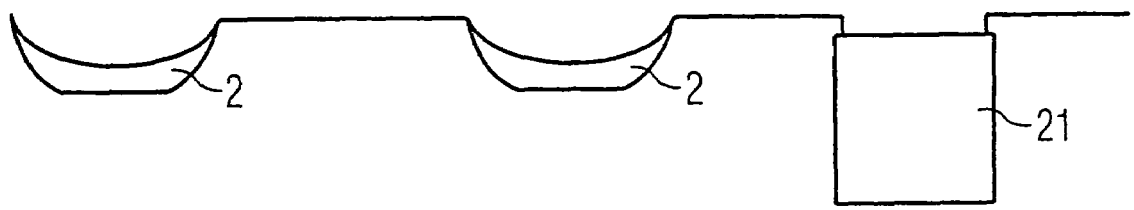
FIG. 14A is a fragmentary, cross-sectional view of the resultant memory cell array along direction A in FIG. 2 in a step for removing the bitline oxide in the method for providing a bitline contact according to the second aspect of the present invention.
Figure 14B:
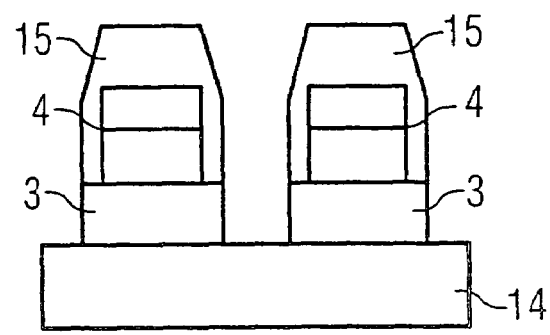
FIG. 14B is a fragmentary, cross-sectional view of the resultant memory cell array along direction B in FIG. 2 in a step for removing the bitline oxide in the method for providing a bitline contact according to the second aspect of the present invention.
Figure 14C:
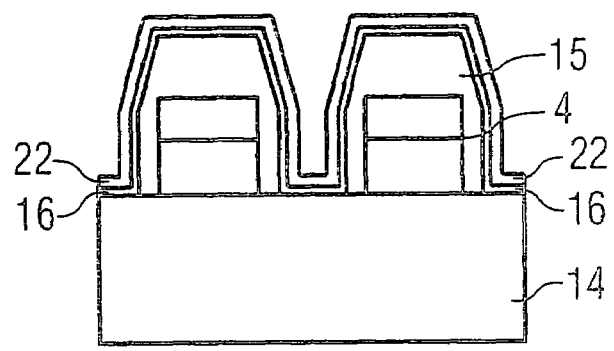
FIG. 14C is a fragmentary, cross-sectional view of the peripheral portion of the chip in a step for removing the bitline oxide in the method for providing a bitline contact according to the second aspect of the present invention.

In the next step, the silicon dioxide is selectively etched with respect to silicon. To avoid that the nitride spacer of the gate electrodes will be attacked, it is important that the silicon dioxide is etched selectively with respect to silicon nitride, too. Because this etching process is time controlled, the silicon dioxide filled in the isolation trenches 21 will not be substantially attacked. Moreover, the bitlines formed of highly doped silicon will not be etched. Accordingly, the silicon dioxide is removed from the whole cell array, whereas the peripheral portion remains unaffected because it is protected by the silicon nitride layer 22, as can be seen from FIGS. 14A to 14C, wherein FIGS. 14A and 14B show a cross-sectional view of the resultant memory cell array along direction A or B as defined in FIG. 2, respectively, whereas FIG. 14C shows a cross-sectional view of the peripheral portion of the chip.

Because the bitline oxide is etched selectively with respect to silicon nitride and, in addition, the wordlines have been covered by an isolating layer such as made of silicon dioxide before depositing the photoresist material, the spacer on the wordlines is not attacked by this etching step.

This step of etching the silicon dioxide layer removes the silicon dioxide layer from the whole memory cell array. In detail, the bitline oxide is etched from the bitlines at the portions that are not covered by the wordlines, and, in addition, a silicon dioxide layer is etched from the portions between the bitlines 2 that are not covered by the wordlines 4. In particular, if in the step of etching the wordlines, the ONO multi-layer stack has not been attacked, now the top oxide layer 7 is etched. On the other hand, if in the step of etching the wordlines the top oxide layer 7 and the nitride layer 6 have been etched, now the bottom oxide layer 5 is etched.

As a further modification of the described process steps, the spacer of the gate electrodes may as well be formed of silicon dioxide. Accordingly, the silicon nitride liner, which was deposited after the spacer formation, protects the underlying silicon dioxide spacer from etching. Because silicon dioxide has a higher resistance to breakthrough, the use of a silicon dioxide spacer is highly advantageous.

In the next steps, an electrical conductive material will be provided on the exposed portions of the bitlines. This can be done by a conventional process, which provides self-aligned contacts as was outlined above, or, according to a preferred embodiment of the present invention, by a so-called inverse poly etch as will be explained later.

For providing the electrical conductive material in the contact hole by a conventional process, first, a silicon oxynitride liner followed by a boron phosphorous silicate glass (BPSG) is deposited over the entire chip area. Thereafter, a silicon dioxide layer is deposited by a chemical vapor deposition process using TEOS (tetraethylorthosilicate). In this layer stack, the contact holes will be etched.

Then, a photoresist material is coated and the contact holes for contacting the bitlines are defined lithographically using a contact hole mask. The contact hole mask is configured so that every 3rd or 4th memory cell is connected with the metal lines that are to be formed later. After defining the contact holes in the photoresist layer, the silicon dioxide layer as well as the BPSG material are selectively etched, for example, by dry etching with $C_4F_8$ or $C_5F_8$.

In a following step, the photoresist material is removed from the cell area and, optionally, an ion implantation step with arsenic ions is performed so as to reduce the contact resistance.

In the next step, an electrical conductive material such as $n^+$-doped polysilicon is deposited so as to fill the contact holes. Then, the polysilicon on the chip surface is recessed, for example, by wet etching or plasma etching using the BPSG layer as an etch stop layer. Thereafter, the metal lines will be formed in a manner that will be described later.

According to a preferred embodiment of the present invention, an electrical conductive material such as $n^+$-doped polysilicon is provided by a so-called inverse poly etch process in which a doped polysilicon layer is deposited over the whole chip area, and this polysilicon layer is removed from those portions at which no contact is to be made.

Figure 15A:
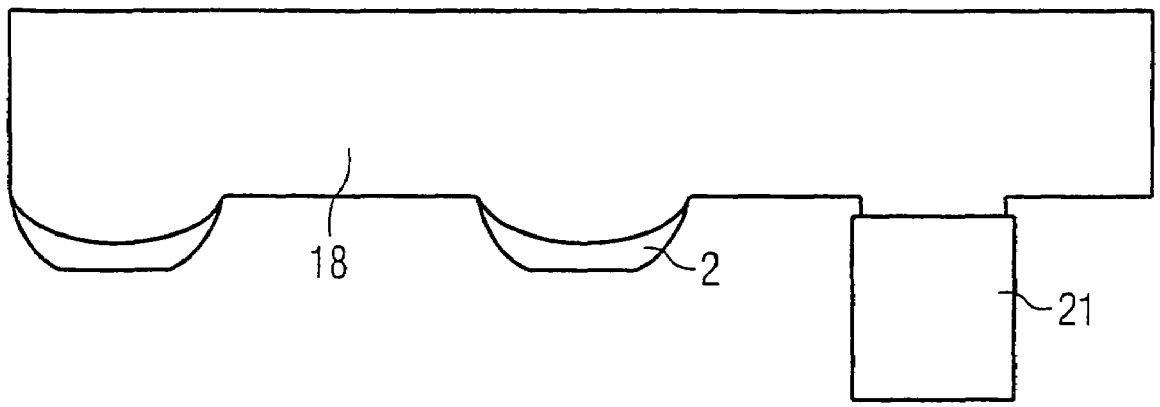
FIG. 15A is a fragmentary, cross-sectional view of the memory cell array along direction A in FIG. 2 in a step for providing an electrical conductive material in the method for providing a bitline contact according to the second aspect of the present invention.
Figure 15B:
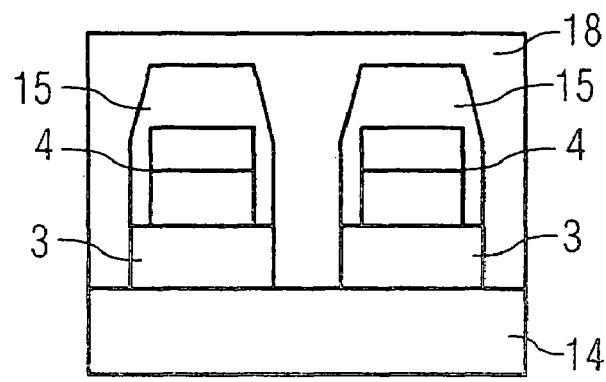
FIG. 15B is a fragmentary, cross-sectional view of the memory cell array along direction B in FIG. 2 in a step for providing an electrical conductive material in the method for providing a bitline contact according to the second aspect of the present invention.
Figure 15C:
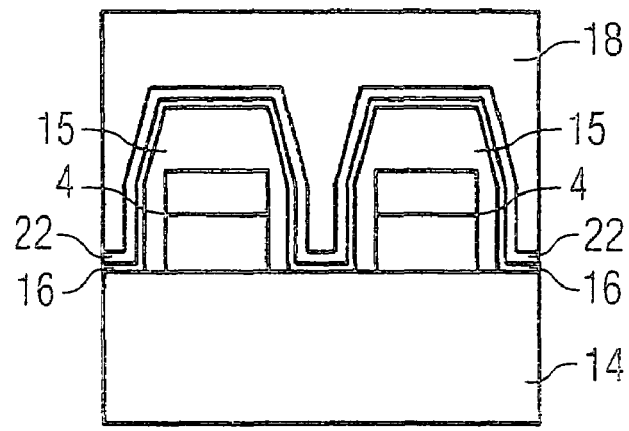
FIG. 15C is a fragmentary, cross-sectional view of the logic devices disposed in the peripheral portion of the chip in a step for providing an electrical conductive material in the method for providing a bitline contact according to the second aspect of the present invention.

First, a wet cleaning process is performed to remove silicon dioxide residues as well as a native oxide from the silicon surface so that the doped polysilicon layer will be directly deposited on the silicon surface. Thereafter, a highly n-doped polysilicon layer 18 is deposited so as to cover the whole chip area. Next, a chemical mechanical polishing step with a target of approximately 100 nm above the nitride cap of the wordline is performed. The resulting structure is shown in FIGS. 15A to 15C, wherein FIG. 15A shows a cross-sectional view of the memory cell array along direction A as defined in FIG. 2, FIG. 15B shows a cross-sectional view of the memory cell array along direction B as defined in FIG. 2, and FIG. 15C shows a cross-sectional view of the logic devices disposed in the peripheral portion of the chip.

Thereafter, a hardmask layer 19 of silicon nitride having a thickness of approximately 200 nm is deposited, and a non-illustrated photoresist material is coated. Using a mask having a stripe pattern, for example, a mask similar to that shown in FIG. 4A, the photoresist material is patterned so that in the resulting photoresist pattern the areas between the bitlines 2 are exposed. The mask having a stripe pattern can, for example, be generated using the bitline mask.

Then, in the exposed areas between the bitlines 2, the hardmask layer 19 is removed and the $n^+$-doped polysilicon 18 is removed by etching selectively with respect to silicon nitride. If during the step of patterning the wordlines 4 the top oxide layer 7 and the nitride layer 6 have not been removed from between the wordlines 4, this etching step will stop on the nitride layer 6.

According to an especially preferred embodiment of the present invention, the top oxide layer 7 and the nitride layer 6 have been removed from between the wordlines 4 during the step of patterning the wordlines 4 so that, now, no etch stop is present and the silicon substrate 1 is slightly etched in the cell area between the bit lines. The overetching is, preferably, performed time controlled so that a depth of the substrate larger than the implantation depth of the bitlines is etched.

Thereby, an isolation trench is formed in the memory cell array in a self-aligned manner. Accordingly, by providing an isolating material in the isolation trench, neighboring bitlines can be electrically isolated. Thus, an additional self-aligned shallow trench isolation procedure can be performed that is advantageous with respect to the conventional shallow trench isolation procedure because in the procedure of the present invention there is no need of increasing the cell size to provide the isolation trenches.

Figure 16A:
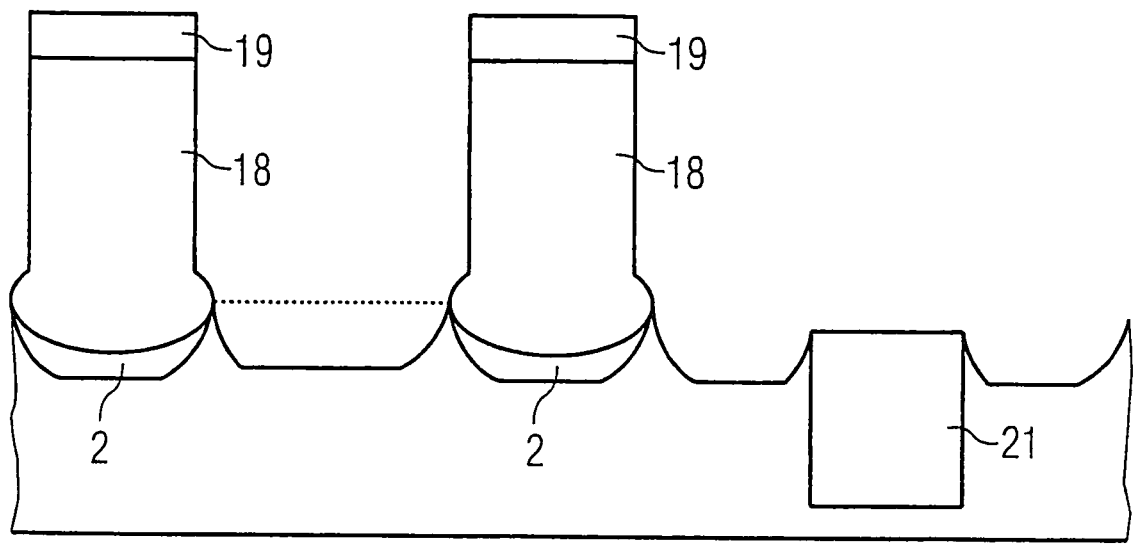
FIG. 16A is a fragmentary, cross-sectional view of the memory cell array along direction A in FIG. 2 in a step for providing an electrical conductive material in the method for providing a bitline contact according to the second aspect of the present invention.
Figure 16B:
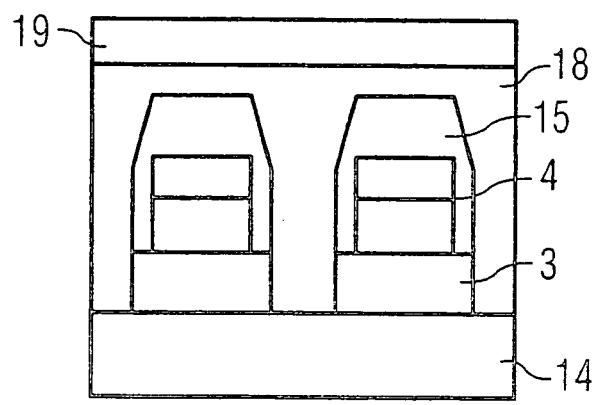
FIG. 16B is a fragmentary, cross-sectional view of the memory cell array along direction B in FIG. 2 in a step for providing an electrical conductive material in the method for providing a bitline contact according to the second aspect of the present invention.
Figure 16C:
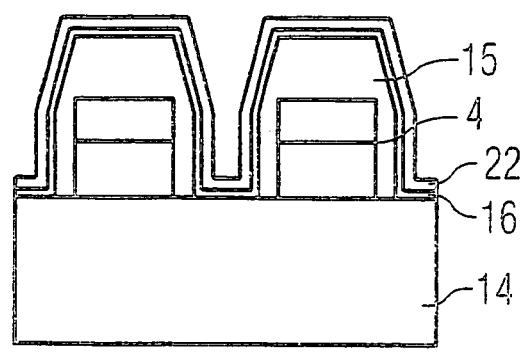
FIG. 16C is a fragmentary, cross-sectional view of the logic devices disposed in the peripheral part of the chip in a step for providing an electrical conductive material in the method for providing a bitline contact according to the second aspect of the present invention.

In a following step, the photoresist material will be removed. After removing the photoresist material, a structure as shown in FIGS. 16A to 16C is obtained, wherein FIG. 16A shows a cross-sectional view of the memory cell array along direction A as defined in FIG. 2, FIG. 16B shows a cross-sectional view of the memory cell array along direction B as defined in FIG. 2, and FIG. 16C shows a cross-sectional view of the logic devices disposed in the peripheral part of the chip. As can be clearly seen from FIGS. 16A and 16B, the polysilicon 18 remains only at those portions above the bitlines 2, whereas it is completely removed over the logic components in FIG. 16C. Because a thin silicon dioxide layer 16 and a thin silicon nitride layer 22 were deposited before removing the bitline oxide, the peripheral portion is protected from etching.

Figure 17A:
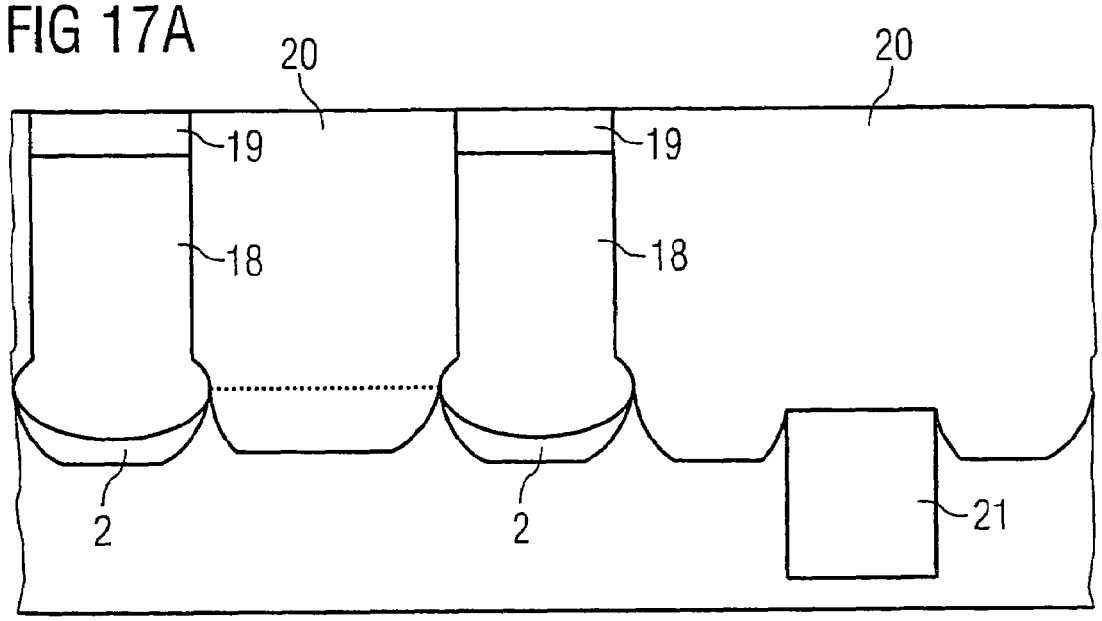
FIG. 17A shows a cross-sectional view of the memory cell array along direction A in FIG. 2 in a step for providing an electrical conductive material in the method for providing a bitline contact according to the second aspect of the present invention.
Figure 17B:
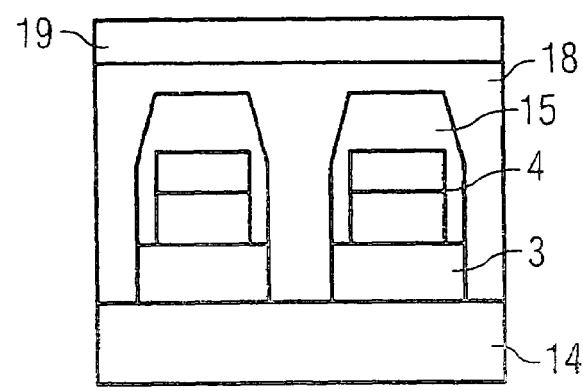
FIG. 17B shows a cross-sectional view of the memory cell array along direction B in FIG. 2 in a step for providing an electrical conductive material in the method for providing a bitline contact according to the second aspect of the present invention.
Figure 17C:
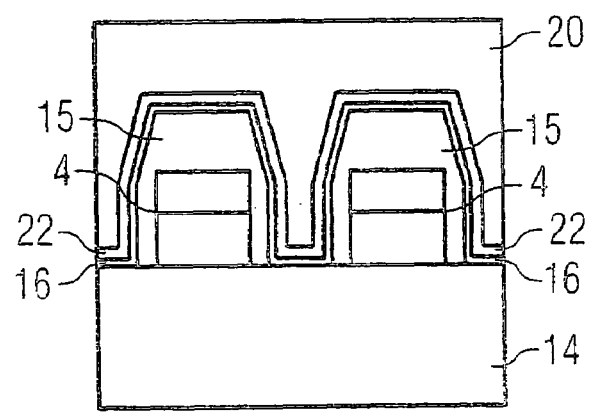
FIG. 17C shows a cross-sectional view of the logic devices disposed in the peripheral part of the chip in a step for providing an electrical conductive material in the method for providing a bitline contact according to the second aspect of the present invention.

Thereafter, a boron phosphorous-doped silicate glass (BPSG) layer 20 is deposited over the entire chip area and it is planarized using chemical mechanical polishing using the silicon nitride hardmask as a stop. The resultant structure is shown in FIGS. 17A to 17C, wherein FIG. 17A shows a cross-sectional view of the memory cell array along direction A as defined in FIG. 2, FIG. 17B shows a cross-sectional view of the memory cell array along direction B as defined in FIG. 2, and FIG. 17C shows a cross-sectional view of the logic devices disposed in the peripheral part of the chip.

Accordingly, the bitline contacts are completed by providing an electrical conductive material by a method in which, first, the material is deposited over the whole chip area and, then, it is removed from the areas at which a contact is not to be made. As a consequence, a self-aligned etching step in which the wordlines act as an etching mask and, thus, could be attacked, does not occur. Because the etching step is not self-aligned, the width between the word lines can be further reduced so that the thickness of the spacers on the gate electrodes can be increased. As a consequence, shorts between wordlines and bitline contacts can be largely avoided whereby the device performance is greatly improved.

The device performance can be remarkably improved if a self-aligned shallow trench isolation is provided. As can be clearly seen from FIG. 17A, isolation trenches filled with boron phosphorous glass are formed between the bitlines so as to provide an electrical isolation.

After removing the silicon nitride hardmask, the metal lines will be formed. The metal lines can be formed using the so-called damascene technique or any other arbitrary process. For creating the metal lines using the so-called damascene technique, first a silicon dioxide layer is deposited onto the entire chip area by a chemical vapor deposition process using tetraethylorthosilicate. Thereafter, trenches are etched into the silicon dioxide layer using a mask having a stripe pattern, for example the mask as used for defining the bitline contacts or a similar mask.

Then, a titanium liner and a layer of tungsten are deposited and the trenches are filled with these metals. Finally, the surface is planarized using chemical mechanical polishing or etching back of the metal so that the trenches are completely filled and no metal remains in the spaces between the trenches so that the trenches are electrically isolated from each other.

According to a different process, it is also possible to first deposit a titanium liner and the tungsten material, deposit a photoresist material, lithographically define the metal lines using a mask having a stripe pattern, for example, the bitline mask, etch the metal layers, and deposit silicon dioxide to electrically isolate the metal lines from each other. Thereafter, the memory chip is completed in a conventional manner.

According to a further non-illustrated modification of the second aspect of the present invention, on the structures as shown in FIGS. 5A to 5C, only a thin silicon dioxide layer 16 having an appropriate thickness as defined above is deposited, and the thin silicon nitride layer 22 is omitted.

In the next step, the peripheral portion of the chip is masked by a photoresist material, and the silicon dioxide is etched in the memory part of the chip. Then, the electrical conductive material is provided on the exposed portions of the bitlines. To this end, the conventional process for providing self-aligned contacts as explained above can be performed. It is also possible to perform the inverse poly etching process as explained above. However, because in this case the peripheral portion of the chip is not protected by the silicon nitride layer 22, it is necessary that the doped polysilicon is etched selectively with respect to silicon dioxide to avoid that the logic components will be attacked. Thereafter, the memory chip will be completed in the manner as described above.

We claim:

1. A method for providing bitline contacts in a memory cell array, which comprises:
disposing a plurality of bitlines in a first direction;
covering the bitlines with an isolating layer;
disposing a plurality of wordlines in a second direction crossing the first direction above the bitlines;
disposing memory cells where the bitlines and wordlines cross one another;
removing the isolating layer completely from the bitlines at portions not covered by the wordlines with areas between the bitlines remaining unaffected, carrying out the step of removing the isolating layer from the bitlines by:
depositing a photoresist material;
patterning the photoresist material using a mask having a stripe pattern; and
selectively etching the isolating layer with respect to the wordlines; and
providing an electrical conductive material on exposed portions of the bitlines.

2. The method according to claim 1, which further comprises providing the mask having the stripe pattern as the bitline mask by which the bitlines have been defined.

3. The method according to claim 1, which further comprises carrying out the bitline disposing step by disposing the bitlines with the mask having the stripe pattern.

4. A method for providing bitline contacts in a memory cell array, which comprises:
disposing a plurality of bitlines in a first direction on a substrate;
disposing a plurality of wordlines in a second direction crossing the first direction above the bitlines on the substrate;
disposing memory cells where the bitlines and wordlines cross one another, the memory cells forming a memory cell array;
covering the bitlines with a first isolating layer;
covering, with at least one second isolating layer, all portions of the memory cell array between the bitlines not covered by the wordlines;
removing the first isolating layer from the bitlines by a step in which also a topmost of the at least one second isolating layer is removed from the memory cell array at portions not covered by the wordlines, carrying out the removing step by:
depositing a photoresist material;
photolithographically patterning the photoresist material causing the photoresist material to be removed within the memory cell array but remain in a peripheral portion of the array; and
selectively etching each of the second and first isolation layers causing the isolation layer to be completely removed from the bitlines in areas not covered by the word lines; and
providing an electrical conductive material on exposed portions of the bitlines.

5. The method according to claim 4, which further comprises carrying out the step of removing the first isolating layer by time-controlled etching of the first isolating layer selectively with respect to the wordlines.

6. The method according to claim 1, which further comprises carrying out the step of providing the electrical conductive material on the exposed portions of the bitlines by:
depositing an isolating material onto the memory cell array;
coating a photoresist material and lithographically defining contact holes in the photoresist material;
etching the isolating material to create the contact holes; and
depositing the electrical conductive material to fill the contact holes with the electrical conductive material.

7. The method according to claim 4, which further comprises carrying out the step of providing the electrical conductive material on the exposed portions of the bitlines by:
depositing an isolating material onto the memory cell array;
coating a photoresist material and lithographically defining contact holes in the photoresist material;
etching the isolating material to create the contact holes; and
depositing the electrical conductive material to fill the contact holes with the electrical conductive material.

8. The method according to claim 1, which further comprises carrying out the step of providing the electrical conductive material on the exposed portions of the bitlines by:
depositing the electrical conductive material onto the memory cell array;
removing the electrical conductive material from areas between the bitlines; and
depositing an isolating material in the areas between the bitlines.

9. The method according to claim 1, which further comprises carrying out the step of providing the electrical conductive material on the exposed portions of the bitlines by:
depositing the electrical conductive material onto the memory cell array;
removing the electrical conductive material from areas between the bitlines; and
depositing an isolating material in the areas between the bitlines.

10. The method according to claim 2, which further comprises carrying out the step of providing the electrical conductive material on the exposed portions of the bitlines by:
depositing the electrical conductive material onto the memory cell array;
removing the electrical conductive material from areas between the bitlines; and
depositing an isolating material in the areas between the bitlines.

11. The method according to claim 8, which further comprises carrying out the step of removing the electrical conductive material from the areas between the bitlines by:
coating a photoresist material on the electrical conductive material and lithographically defining regions where the electrical conductive material is to be removed using a mask having a stripe pattern; and
removing the electrical conductive material in the exposed regions.

12. The method according to claim 4, which further comprises carrying out the step of providing the electrical conductive material on the exposed portions of the bitlines by;

depositing the electrical conductive material onto the memory cell array;

removing the electrical conductive material from areas between the bitlines; and depositing an isolating material in the areas between the bitlines.

13. The method according to claim 5, which further comprises carrying out the step of providing the electrical conductive material on the exposed portions of the bitlines by:

depositing the electrical conductive material onto the memory cell array;

removing the electrical conductive material from areas between the bitlines; and depositing an isolating material in the areas between the bitlines.

14. The method according to claim 12, which further comprises carrying out the step of removing the electrical conductive material from the areas between the bitlines by:

coating a photoresist material on the electrical conductive material and lithographically defining regions where the electrical conductive material is to be removed using a mask having a stripe pattern; and removing the electrical conductive material in the exposed regions.

15. The method according to claim 14, which further comprises carrying out the step of removing the first isolating layer from the bitlines to expose the substrate at the portions between the bitlines not covered by the wordlines, and performing the step of etching the electrical conductive material as an over-etching step to remove part of the substrate under the electrical conductive material.

16. The method according to claim 8, which further comprises carrying out the depositing an isolating material depositing step by depositing, in the areas between the bitlines, a silicate glass doped with at least one of boron and phosphorous.

17. The method according to claim 12, which further comprises carrying out the depositing an isolating material depositing step by depositing, in the area between the bitlines, a silicate glass doped with at least one of boron and phosphorous.

18. The method according to claim 1, which further comprises carrying out the electrical conductive material providing step by providing doped polysilicon on exposed portions of the bitlines.

19. The method according to claim 4, which further comprises carrying out the electrical conductive material providing step by providing doped polysilicon on exposed portions of the bitlines.

20. A method of fabricating a nitride read only memory chip, which comprises:

providing a memory cell array with memory cells, bitlines, and wordlines, each of the memory cells having a metal-insulator-semiconductor field effect transistor with the insulator being an oxide-nitride-oxide multilayer stack for storing at least one injected electron;

disposing the bitlines in a first direction and the wordlines in a second direction perpendicular to the first direction and above the bitlines;

disposing the memory cells at points at which the bitlines and the wordlines cross one another and at which the bitlines are covered by an isolating layer;

providing a peripheral portion having logic components;

providing an electrical contact between the bitlines and metal lines to be formed in a following step by forming bitline contacts by:

removing the isolating layer completely from the bitlines at portions not covered by the wordlines with areas between the bitlines remaining unaffected, carrying out the step of removing the isolating layer from the bitlines by:

depositing a photoresist material;

patterning the photoresist material using a mask having a stripe pattern; and selectively etching the isolating layer with respect to the wordlines; and providing an electrical conductive material on exposed portions of the bitline; and disposing the metal lines in the first direction above the bitlines.

21. A method of fabricating a nitride read only memory chip, which comprises:

providing a memory cell array with memory cells, bitlines, and wordlines, each of the memory cells having a metal-insulator-semiconductor field effect transistor with the insulator being an oxide-nitride-oxide multilayer stack for storing at least one injected electron;

disposing the bitlines in a first direction on a substrate and the wordlines in a second direction perpendicular to the first direction and above the bitlines on the substrate;

disposing the memory cells at points at which the bitlines and the wordlines cross one another and at which the bitlines are covered by a first isolating layer;

providing a peripheral portion having logic components;

providing an electrical contact between the bitlines and metal lines to be formed in a following step by forming bitline contacts by:

covering, with at least one second isolating layer, all portions of the memory cell array between the bitlines not covered by the wordlines;

removing the first isolating layer from the bitlines by a step in which also a topmost of the at least one second isolating layer is removed from the memory cell array at portions not covered by the wordlines, carrying out the removing step by:

depositing a photoresist material;

photolithographically patterning the photoresist material causing the photoresist material to be removed within the memory cell array but remain in a peripheral portion of the array; and selectively etching each of the second and first isolation layers causing the isolation layer to be completely removed from the bitlines in areas not covered by the word lines; and providing an electrical conductive material on exposed portions of the bitlines; and disposing the metal lines in the first direction above the bitlines.

22. A memory cell array having bitline contacts produced by the method according to claim 1.

23. A memory cell array having bitline contacts produced by the method according to claim 4.

24. A nitride read only memory chip fabricated by the method of claim 20.

25. A nitride read only memory chip fabricated by the method of claim 21.

* * * * *